United States Patent
Kim et al.

(10) Patent No.: US 8,598,619 B2
(45) Date of Patent: Dec. 3, 2013

(54) SEMICONDUCTOR LIGHT EMITTING DEVICE HAVING MULTI-CELL ARRAY AND METHOD FOR MANUFACTURING THE SAME

(75) Inventors: Je Won Kim, Seoul (KR); Tae Sung Jang, Gyunggi-do (KR); Jong Gun Woo, Gyunggi-do (KR); Jong Ho Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 309 days.

(21) Appl. No.: 13/034,136

(22) Filed: Feb. 24, 2011

(65) Prior Publication Data

US 2011/0210351 A1  Sep. 1, 2011

(30) Foreign Application Priority Data

Feb. 26, 2010 (KR) .................. 10-2010-0018259
Sep. 1, 2010 (KR) .................. 10-2010-0085707

(51) Int. Cl.
*H01L 33/00* (2010.01)

(52) U.S. Cl.
USPC 257/103; 257/88; 257/E33.001; 257/E33.045; 257/E33.046; 257/E33.062; 257/E33.066; 257/E27.121; 438/22; 438/24; 438/26; 438/28; 438/110; 438/128; 438/956; 438/964; 362/249.02; 362/543; 362/545; 362/612; 362/613; 315/185 R; 315/246; 313/494; 313/498

(58) Field of Classification Search
USPC .............. 257/88, 103, E33.001, E33.045, 257/E33.046, E33.062, E33.066, E27.121; 438/22, 24, 26, 28, 110, 128, 956, 964; 362/249.02, 543, 545, 612, 613, 800; 315/185 R, 246; 313/494, 498; 355/82, 355/83
See application file for complete search history.

(56) References Cited

U.S. PATENT DOCUMENTS

| | | | |
|---|---|---|---|
| 6,547,249 B2 | 4/2003 | Collins, III et al. | |
| 2006/0169993 A1 | 8/2006 | Fan et al. | |
| 2007/0262323 A1 | 11/2007 | Sonobe et al. | |
| 2008/0149945 A1 | 6/2008 | Nagai | |
| 2009/0108269 A1 | 4/2009 | Negley et al. | |
| 2009/0109151 A1 | 4/2009 | Kim et al. | |
| 2010/0123145 A1* | 5/2010 | Lee ................................. | 257/89 |
| 2010/0213474 A1 | 8/2010 | Hsu et al. | |

FOREIGN PATENT DOCUMENTS

| | | |
|---|---|---|
| EP | 2 200 085 A1 | 6/2010 |
| KR | 10-2006-0100669 A | 9/2006 |
| KR | 10-2008-0113049 | 12/2008 |
| WO | WO 2005/008791 A2 | 1/2005 |
| WO | WO 2005/022654 A2 | 3/2005 |
| WO | WO 2009/055079 A1 | 4/2009 |

OTHER PUBLICATIONS

Extended European Search Report issued in European Patent Application No. 11153609.0, dated Aug. 22, 2011.
United States Office Action issued in U.S. Appl. No. 13/035,063 dated Apr. 9, 2013.
Office Action dated Feb. 4, 2013 issued in Chinese Patent Application No. 201110056959.3.

* cited by examiner

*Primary Examiner* — Meiya Li
(74) *Attorney, Agent, or Firm* — McDermott Will & Emery LLP

(57) ABSTRACT

A semiconductor light emitting device includes a substrate and a plurality of light emitting cells arranged on the substrate. Each of the light emitting cells includes a first-conductivity-type semiconductor layer, a second-conductivity-type semiconductor layer, and an active layer disposed therebetween to emit blue light. An interconnection structure electrically connects the first-conductivity-type and the second-conductivity-type semiconductor layers of one light emitting cell to the first-conductivity-type and the second-conductivity-type semiconductor layers of another light emitting cell. A light conversion part is formed in a light emitting region defined by the light emitting cells and includes a red and/or a green light conversion part respectively having a red and/or a green light conversion material.

20 Claims, 25 Drawing Sheets

A – A'

A–A'

A – A'

SEMICONDUCTOR LIGHT EMITTING DEVICE HAVING MULTI-CELL ARRAY AND METHOD FOR MANUFACTURING THE SAME

CROSS-REFERENCE TO RELATED APPLICATIONS

This application claims the priorities of Korean Patent Application Nos. 2010-0018259 filed on Feb. 26, 2010 and 2010-0085707 filed on Sep. 1, 2010 in the Korean Intellectual Property Office, the disclosure of which is incorporated herein by reference.

BACKGROUND OF THE INVENTION

1. Field of the Invention

The present invention relates to a semiconductor light emitting device, and more particularly, to a semiconductor light emitting device, in which a plurality of light emitting cells are arranged, and a method for manufacturing the same.

2. Description of the Related Art

In general, semiconductor light emitting diodes (LEDs) are advantageous for light sources in terms of power, efficiency and reliability. Therefore, semiconductor LEDs are being actively developed as high-power, high-efficiency light sources for various illumination apparatuses as well as for a backlight unit of a display device. For the commercialization of such semiconductor LEDs as illumination light sources, it is necessary to increase their efficiency and reduce their production cost while increasing their power to a desired level.

However, a high-power LED using a high rated current may have low light efficiency due to a high current density, when compared to a low-power LED using a low-rated current. Specifically, if a rated current is increased to obtain high luminous flux in an LED chip of the same area in order to obtain high power, the light efficiency may be degraded due to an increase in the current density. Also, the light efficiency degradation is accelerated due to heat generation by the device.

To solve these problems, there has been proposed a high-power light emitting device in which a plurality of low-power LED chips are die-bonded at a package level and the chips thereof are connected by wire bonding. According to this approach, since the low-power LED chips having a relatively small size are used, current density is further reduced and thus an overall light efficiency is increased, as compared to a case of using high-power LED chips having a large size. However, as the number of wire bondings increases, manufacturing costs increase and manufacturing processes become complicated. In addition, a fail rate due to a wire open condition increases. When the chips are connected by wires, it is difficult to implement a complicated serial-parallel interconnection structure. Due to the space occupied by the wires, it is difficult to achieve the miniaturization of the package. Moreover, there is a limit on the number of chips which are mountable in a single package.

SUMMARY OF THE INVENTION

An aspect of the present invention provides a semiconductor light emitting device which can improve light efficiency by increasing current density per unit area, and can emit white light having high color rendering.

An aspect of the present invention also provides a semiconductor light emitting device, which can obtain high-efficiency white light without using phosphors, and a method for manufacturing the same.

An aspect of the present invention also provides a semiconductor light emitting device which can ensure a sufficient light emitting area when a plurality of light emitting cells are provided therein.

According to an aspect of the present invention, there is provided a semiconductor light emitting device including: a substrate; a plurality of light emitting cells arranged on the substrate, each of the light emitting cells including a first-conductivity-type semiconductor layer, a second-conductivity-type semiconductor layer, and an active layer disposed therebetween to emit blue light; an interconnection structure electrically connecting at least one of the first-conductivity-type semiconductor layer and the second-conductivity-type semiconductor layer of the light emitting cell to at least one of the first-conductivity-type semiconductor layer and the second-conductivity-type semiconductor layer of another light emitting cell; and a light conversion part formed in at least a portion of a light emitting region defined by the plurality of light emitting cells, the light conversion part including at least one of a red light conversion part having a red light conversion material and a green light conversion part having a green light conversion material.

The light conversion part may not be formed in a portion of the light emitting region.

The light conversion part may include at least one of a phosphor and a quantum dot.

The first-conductivity-type semiconductor layer of at least one of the plurality of light emitting cells may be electrically connected to the second-conductivity-type semiconductor layer of another light emitting cell.

The first-conductivity-type semiconductor layer of at least one of the plurality of light emitting cells may be electrically connected to the first-conductivity-type semiconductor layer of another light emitting cell.

The second-conductivity-type semiconductor layer of at least one of the plurality of light emitting cells may be electrically connected to the second-conductivity-type semiconductor layer of another light emitting cell.

The first-conductivity-type semiconductor layers of the plurality of light emitting cells may be integrally formed.

One of the red light conversion part and the green light conversion part may be formed at each of the light emitting cells.

One of the red light conversion part and the green light conversion part may be integrally formed with respect to two or more of the plurality of light emitting cells.

The light conversion part may be formed along the surfaces of the light emitting cells.

The light conversion part may include the red light conversion part and the green light conversion part, the plurality of light emitting cells may be divided into a red group including one or more cells in which the red light conversion part is formed, a green group including one or more cells in which the green light conversion part is formed, and a blue group including one or more cells in which the red light conversion part and the green light conversion part are not formed, and the semiconductor light emitting device may further include three pairs of pads connected to the red group, the green group, and the blue group, respectively.

Currents applied through the pads to the red group, the green group, and the blue group may be independently controlled.

According to another aspect of the present invention, there is provided a semiconductor light emitting device including: a substrate; a plurality of light emitting cells arranged on the substrate, each of the light emitting cells including a first-conductivity-type semiconductor layer, a second-conductivity-type semiconductor layer, and an active layer disposed therebetween to emit blue light; an interconnection structure electrically connecting at least one of the first-conductivity-type semiconductor layer and the second-conductivity-type semiconductor layer of the light emitting cell to at least one of the first-conductivity-type semiconductor layer and the second-conductivity-type semiconductor layer of another light emitting cell; and a light conversion part formed in a light emitting region defined by the plurality of light emitting cells, the light conversion part including at least one of a red light conversion material and a green light conversion material, wherein the light conversion part is divided into a plurality of groups having a different mixture ratio of at least one of the red light conversion material and the green light conversion material.

According to another aspect of the present invention, there is provided a semiconductor light emitting device including: a package substrate; a plurality of multi-chip devices arranged on the package substrate, each of the multi-chip devices including a first-conductivity-type semiconductor layer, a second-conductivity-type semiconductor layer, and an active layer disposed therebetween to emit blue light; an interconnection structure electrically connecting at least one of the first-conductivity-type semiconductor layer and the second-conductivity-type semiconductor layer of the light emitting cell to at least one of the first-conductivity-type semiconductor layer and the second-conductivity-type semiconductor layer of another light emitting cell; and a plurality of light conversion parts disposed on light paths of the multi-chip devices, the light conversion parts including at least one of a red light conversion material and a green light conversion material, wherein the light conversion parts are divided into a plurality of groups having a different mixture ratio of at least one of the red light conversion material and the green light conversion material.

The light conversion parts may further include a yellow light conversion material, and the light conversion parts are divided into a plurality of groups having a different mixture ratio of at least one of the red light conversion material, the green light conversion material, and the yellow light conversion material.

The semiconductor light emitting device may further include a plurality of pads connected to the plurality of groups.

Currents applied through the plurality of pads to the plurality of groups may be independently controlled.

The light conversion part may include a dam part, and the inside of the dam part may be filled with the optical conversion material.

The dam part may include the same material as the optical conversion material.

The dam part may be formed of the same material as the remaining portion of the light conversion part filled in the inside thereof.

According to another aspect of the present invention, there is provided a semiconductor light emitting device including: a substrate; a plurality of light emitting cells arranged on the substrate, each of the light cells including a first-conductivity-type semiconductor layer, a second-conductivity-type semiconductor layer, and an active layer disposed therebetween; and an interconnection structure electrically connecting at least one of the first-conductivity-type semiconductor layer and the second-conductivity-type semiconductor layer of the light emitting cell to at least one of the first-conductivity-type semiconductor layer and the second-conductivity-type semiconductor layer of another light emitting cell, wherein a part of the light emitting cells emit red light, a part of the light emitting cells emit green light, and the others emit blue light.

The semiconductor light emitting device may further include a base layer formed between the substrate and the first-conductivity-type semiconductor layers and connecting the first-conductivity-type semiconductor layers of the light emitting cells.

The base layer may be formed of a first-conductivity-type semiconductor material.

The base layer may be formed of an undoped semiconductor material.

The first-conductivity-type semiconductor layers of the light emitting cells may be integrally formed.

According to another aspect of the present invention, there is provided a method for manufacturing a semiconductor light emitting device, including: forming a first light emitting structure by sequentially growing a first-conductivity-type semiconductor layer, a first active layer, and a second-conductivity-type semiconductor layer on a first region of a substrate; forming a second light emitting structure by sequentially growing a first-conductivity-type semiconductor layer, a second active layer, and a second-conductivity-type semiconductor layer on a second region of a substrate; forming a third light emitting structure by sequentially growing a first-conductivity-type semiconductor layer, a third active layer, and a second-conductivity-type semiconductor layer on a third region of a substrate; and forming an interconnection structure to electrically connect the first to third light emitting structures, wherein one of the first to third active layers emits red light, another emits green light, and the other emits blue light.

Before forming the first light emitting structure, the method may further include forming a mask layer having a first open region on the substrate, wherein the first light emitting structure is formed in the first open region.

Before forming the second light emitting structure, the method may further include forming a mask layer having a second open region on the substrate, wherein the second light emitting structure is formed in the second open region.

Before forming the third light emitting structure, the method may further include forming a mask layer having a third open region on the substrate, wherein the third light emitting structure is formed in the third open region.

The first to third light emitting structures may not be contacted with one another.

Before forming the first to third light emitting structures, the method may further include forming a base layer on the substrate.

The base layer may be formed of a first-conductivity-type semiconductor material.

The base layer may be formed of an undoped semiconductor layer.

The process of growing the first-conductivity-type semiconductor layer may be a process of re-growing the first-conductivity-type semiconductor layer on the base layer.

According to another aspect of the present invention, there is provided a method for manufacturing a semiconductor light emitting device, including: growing a first-conductivity-type semiconductor layer on a substrate; growing first to third active layers in first to third regions of the first-conductivity-type semiconductor layer; growing a second-conductivity-type semiconductor layer to cover the first to third active layers; forming first to third light emitting structures by removing a portion of the second-conductivity-type semiconductor layer so that the second-conductivity-type semiconductor layer corresponding to positions of the first to third active layers is left; and forming an interconnection structure to electrically connect the first to third light emitting structures, wherein one of the first to third active layers emits red light, another emits green light, and the other emits blue light.

The forming of the first to third light emitting structures may include removing a portion of the first-conductivity-type semiconductor layer so that the first-conductivity-type semiconductor layer corresponding to the positions of the first to third active layers is left.

According to another aspect of the present invention, there is provided a semiconductor light emitting device including: a plurality of light emitting cells arranged on a conductive substrate, each of the light emitting cells including a first-conductivity-type semiconductor layer, a second-conductivity-type semiconductor layer, an active layer formed therebetween, wherein the second-conductivity-type semiconductor layer is directed to the conductive substrate and electrically connected to the conductive substrate; and an interconnection structure electrically connecting the first-conductivity-type semiconductor layer of at least one of the light emitting cells to the first-conductivity-type semiconductor layer of other light emitting cells.

The semiconductor light emitting device may further include a reflective metal layer formed between the conductive substrate and the plurality of light emitting cells.

The interconnection structure may be formed of a metal.

A portion of the interconnection structure which is formed on the top surface of at least the first-conductivity-type semiconductor layer may be formed of a transparent conductive material.

The semiconductor light emitting device may further include a barrier layer formed between the conductive substrate and the plurality of light emitting cells.

The barrier layer may be electrically connected to the second-conductivity-type semiconductor layers of the light emitting cells.

The plurality of light emitting cells may be electrically connected in parallel.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
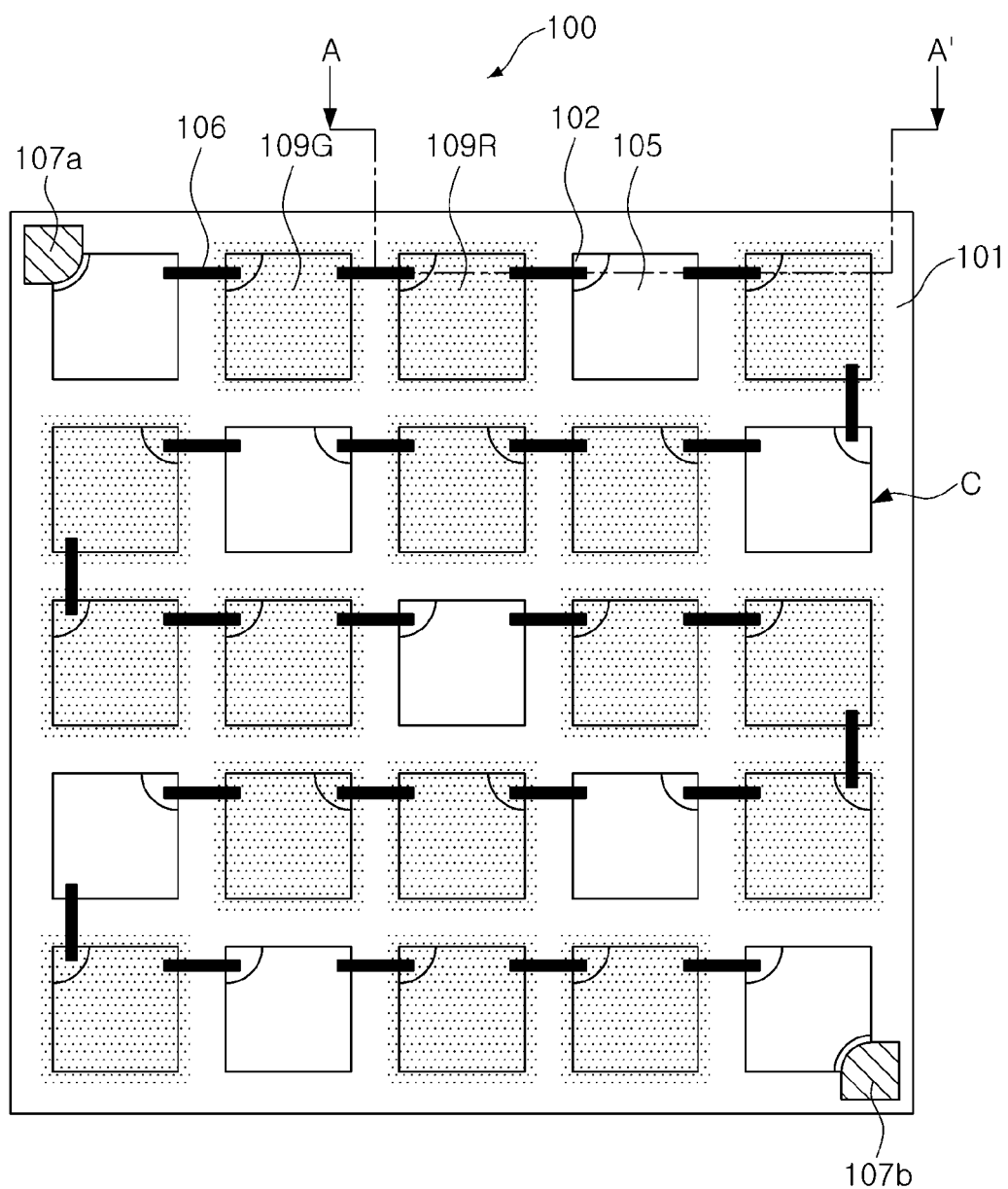
FIG. 1 is a schematic plan view illustrating a semiconductor light emitting device according to an embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

Figure 2:
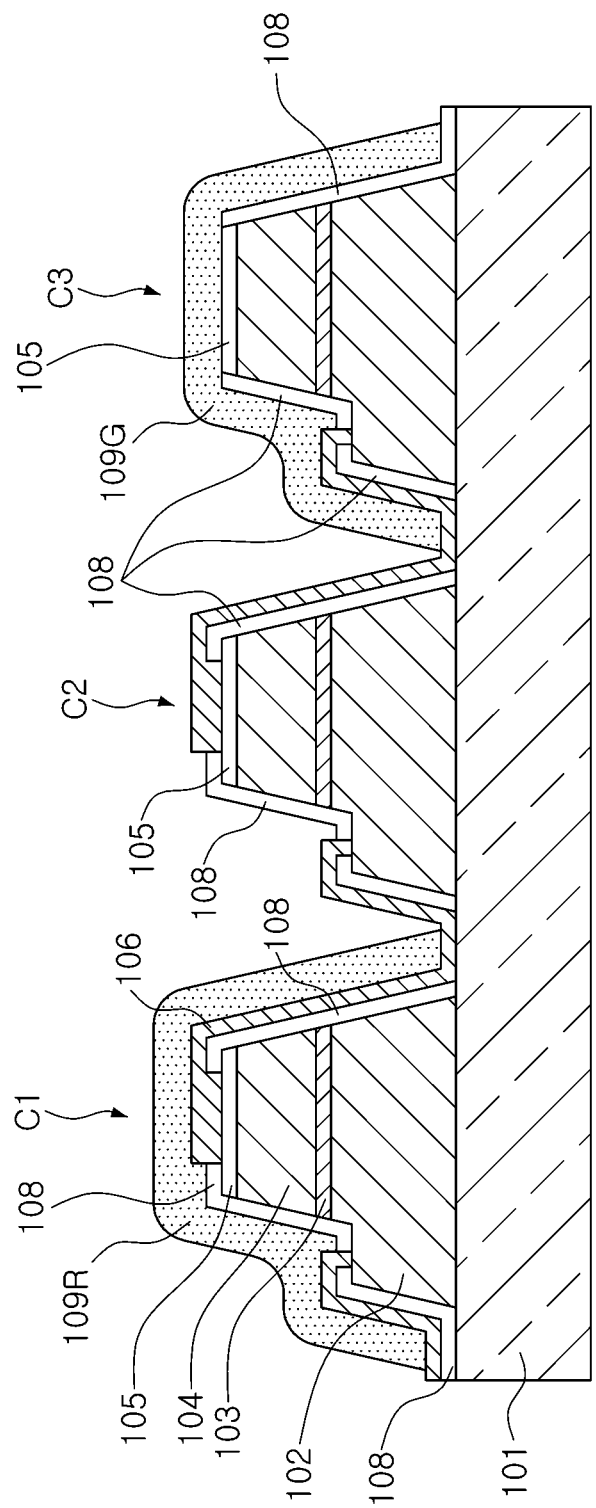
FIG. 2 is a schematic cross-sectional view taken along line A-A' of FIG. 1.
Figure 3:
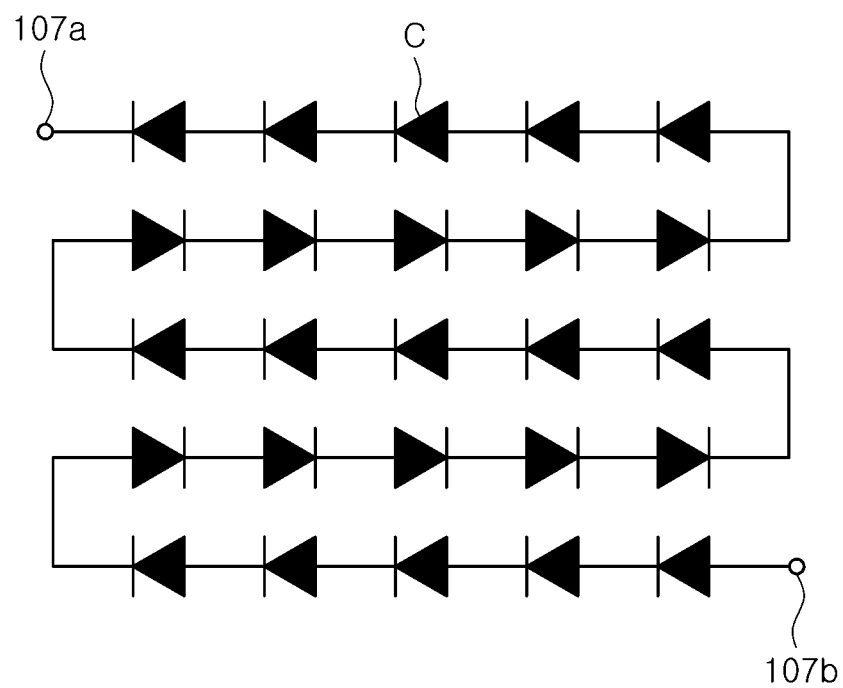
FIG. 3 is an equivalent circuit diagram illustrating a connection of light emitting cells in the semiconductor light emitting device of FIG. 1.
Figure 4:
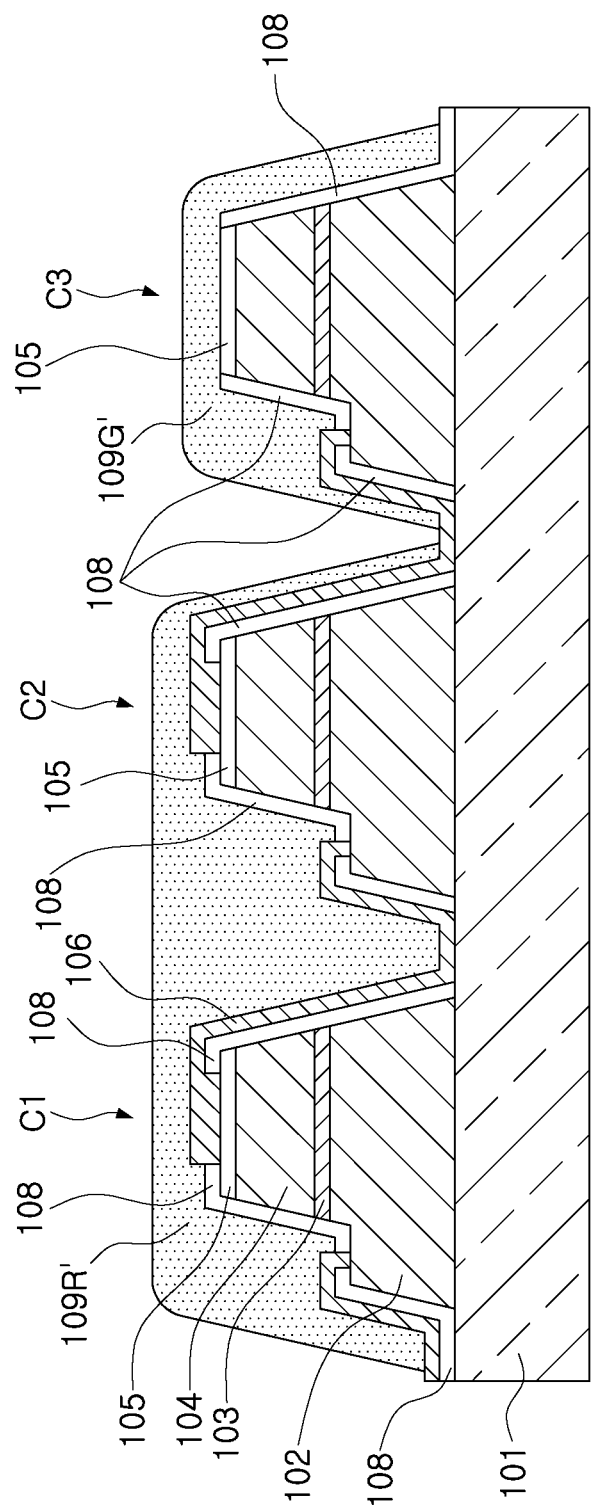
FIG. 4 is a schematic cross-sectional view illustrating a modification of the semiconductor light emitting device of FIG. 1.

FIG. 1 is a schematic plan view illustrating a semiconductor light emitting device according to an embodiment of the present invention. FIG. 2 is a schematic cross-sectional view taken along line A-A' of FIG. 1. FIG. 3 is an equivalent circuit diagram illustrating a connection of light emitting cells in the semiconductor light emitting device of FIG. 1. FIG. 4 is a schematic cross-sectional view illustrating a modification of the semiconductor light emitting device of FIG. 1.

Referring to FIGS. 1 and 2, the semiconductor light emitting device 100 according to the embodiment of the present invention includes a substrate 101 and a plurality of light emitting cells C arranged on the substrate 101. The light emitting cells C are electrically connected together by an interconnection structure 106. In this case, the term "light emitting cell" represents a semiconductor multilayer structure having an active layer region, which is distinguished from other cells. In this embodiment, twenty-five light emitting cells are arranged in a 5×5 pattern; however, the number and arrangement of the light emitting cells C may be variously changed. As an additional element, first and second pads 107a and 107b for the application of external electric signals may be formed on the substrate 101. In this embodiment, the pads 107a and 107b directly contact the light emitting cells C. However, in another embodiment, the pads 107a and 107b and the light emitting cells may be spaced apart from one another and connected together by the interconnection structure 106. In this embodiment, in which the cell is separated into the plurality of light emitting cells C, current density per unit area may be further reduced than in a case in which a single cell is used. Hence, the luminous efficiency of the semiconductor light emitting device 100 may be improved.

As illustrated in FIG. 2, each of the light emitting cells C1, C2 and C3 includes a first-conductivity-type semiconductor layer 102, an active layer 103, and a second-conductivity-type semiconductor layer 104, which are formed on the substrate 101. As illustrated in FIG. 3, the light emitting cells C1, C2 and C3 are connected in series by the interconnection structure 106. In this case, a transparent electrode 105 formed of a transparent conductive oxide may be disposed on the second-conductivity-type semiconductor layer 104. In the series connection structure of the light emitting cells C1, C2 and C3, the second-conductivity-type semiconductor layer 104 of the first light emitting cell C1 and the first-conductivity-type semiconductor layer 102 of the second light emitting cell C2 may be connected together. In addition to the series connection, a parallel connection or a series-parallel connection can also be used herein, which will be described later. In this embodiment, the interconnection structure 106 is not a wire and is formed along the surfaces of the light emitting cells C1, C2 and C3 and the substrate 101, and an insulation part 108 may be disposed between the light emitting cells C1, C2 and C3 and the interconnection structure 106 to thereby prevent unintended electrical shorting. In this case, the insulation part 108 may be formed of a material known in the art, such as silicon oxide or silicon nitride. In this embodiment, since wires are not used as the structure for electrical connection between the cells, the probability of electrical shorting may be reduced and the ease of the interconnection process may be improved.

A substrate having electrical insulation properties may be used as the substrate 101 and thus the light emitting cells C may be electrically isolated from one another. In a case in which a conductive substrate is used, it may be used by depositing an insulation layer thereon. In this case, the substrate 101 may be a growth substrate for growing a single-crystal semiconductor. In this regard, a sapphire substrate may be used. The sapphire substrate is a crystal body having Hexa-Rhombo R3c symmetry. The sapphire substrate has a lattice constant of 13.001 Å in a c-axis orientation and a lattice constant of 4.758 Å in an a-axis orientation; and has a C(0001) plane, an A(1120) plane, and an R(1102) plane. In this case, the C plane of the sapphire substrate allows a nitride thin film to be grown thereupon relatively easily and is stable even at high temperatures, thus it is predominantly used as a substrate for the growth of a nitride semiconductor. In other cases, a substrate formed of SiC, GaN, ZnO, $MgAl_2O_4$, MgO, $LiAlO_2$, or $LiGaO_2$, may also be used.

The first-conductivity-type semiconductor layer 102 and the second-conductivity-type semiconductor layer 104 may be formed of a nitride semiconductor having a composition of $Al_xIn_yGa_{(1-x-y)}N$ (0≤x≤1, 0≤y≤1, 0≤x+y≤1), and may be doped with n-type impurity or p-type impurity. In this case, the first-conductivity-type semiconductor layer 102 and the second-conductivity-type semiconductor layer 104 may be grown by a process known in the art, such as a Metal Organic Chemical Vapor Deposition (MOCVD) process, a Hydride Vapor Phase Epitaxy (HVPE) process, or a Molecular Beam Epitaxy (MBE) process. The active layer 103 formed between the first-conductivity-type semiconductor layer 102 and the second-conductivity-type semiconductor layer 104 emits light having a predetermined level of energy by electron-hole recombination. The active layer 103 may have a structure in which a plurality of layers having a composition of $In_xGa_{1-x}N$ (0≤x≤1) are laminated to adjust a band gap energy according to the content of indium (In). In this case, the active layer 103 may have a multi quantum well (MQW) structure in which a quantum barrier layer and a quantum well layer are alternately laminated, for example, an InGaN/GaN structure. Although not necessarily required, a transparent layer formed of a transparent conducive oxide may be formed on the second-conductivity-type semiconductor layer 104. The transparent electrode may serve to perform an ohmic contact and current distribution function. Meanwhile, as will be described later, the light emitting cells C, each including the first-conductivity-type semiconductor layer 102, the second-conductivity-type semiconductor layer 104, and the active layer 103, may be obtained by a separate growth or may be obtained by growing a light emitting lamination body and separating it into individual cells.

In this embodiment, the active layer 103 emits blue light, for example, light having a peak wavelength of about 430-480 nm. When viewed from above the plurality of light emitting cells C, red and green light conversion parts 109R and 109G are formed in at least a portion of a light emitting region. In the case of FIG. 1, the light emitting region may be considered as a set of rectangular light emitting surfaces defined by the light emitting cells C. The formation of the light conversion parts in the light emitting region corresponds to an application of a material which can convert the wavelength of the light on a path through which the light travels from the light emitting region. For example, the red light conversion part 109R is formed on a light emitting surface of a part of the light emitting cells C (for example, C1 of FIG. 2), and the green light conversion part 109G may be formed on a light emitting surface of at least a part of the others (for example, C2 of FIG. 2). Accordingly, blue light emitted from the light emitting cell C and light emitted from the red and green light conversion parts 109R and 109G may be mixed to obtain white light. However, the red and blue light conversion parts 109R and 109G are not requisite elements. In some embodiments, only one of the red and green light conversion parts 109R and 109G may be provided on the light emitting surface of the light emitting cell C.

The red and green light conversion parts 109R and 109G may include a phosphor and/or a quantum dot. In this case, the red and green light conversion parts 109R and 109G may be dispersed in a silicon resin and coated on the surface of a light emitting structure; however, the invention is not limited thereto. In this embodiment, since the light conversion parts 109R and 109G are coated on the plurality of light emitting cells C, a coating process may be applied to a relatively large area. Therefore, as compared to a case of coating a phosphor material on each unit chip, a case of forming the plurality of cells C in the single device and forming the light conversion parts 109R and 109G in the light emitting region is advantageous in terms of process facilitation. In this embodiment, the area of the light conversion parts 109R and 109G is wider than the occupied area of the light emitting cell C. However, the light emitting parts 109R and 109G may be formed to cover a portion of the surface of the light emitting cell C, for example, only the top surface thereof, according to process conditions or necessity.

In addition, in this embodiment, one of the red and green light conversion parts 109R and 109G is applied to each light emitting cell C. However, one of the red and green light conversion parts 109R and 109G may be formed over two or more light emitting cells C. Such a structure may also be applied to the following embodiments. Furthermore, although it is illustrated in FIG. 2 that the light conversion parts 109R and 109G are formed along the surface of the light emitting cell C and thus they have a similar shape to that of the light emitting cell C, the light conversion parts 109R and 109G may not be formed along the surface of the light emitting cell C and may be formed to have a dome shape as in a modification example of FIG. 4. Moreover, as in the modification example of FIG. 4, a single light conversion part 109R' may be integrally applied to two or more light emitting cells C1 and C2.

Examples of a red phosphor which can be used in the red light conversion part 109R include a nitride phosphor having a composition of MAlSiNx:Re ($1 \leq x \leq 5$) or a sulfide phosphor having a composition of MD:Re. M is at least one selected from Ba, Sr, Ca, and Mg; D is at least one selected from S, Se, and Te; and Re is at least one selected from Eu, Y, La, Ce, Nd, Pm, Sm, Gd, Tb, Dy, Ho, Er, Tm, Yb, Lu, F, Cl, Br, and I. In addition, examples of a green phosphor which can be used in the green light conversion part 109G include a silicate phosphor having a composition of $M_2SiO_4$:Re, a sulfide phosphor having a composition of $MA_2D_4$:Re, a phosphor having a composition of β-SiAlON:Re, and an oxide phosphor having a composition of $MA'_2O_4$:Re'. M is at least one selected from Ba, Sr, Ca, and Mg; A is at least one selected from Ga, Al, and In; D is at least one selected from S, Se, and Te; A' is at least one selected from Sc, Y, Gd, La, Lu, Al, and In; Re is at least one selected from Eu, Y, La, Ce, Nd, Pm, Sm, Gd, Tb, Dy, Ho, Er, Tm, Yb, Lu, F, Cl, Br, and I; and Re' is at least one selected from Ce, Nd, Pm, Sm, Tb, Dy, Ho, Er, Tm, Yb, F, Cl, Br, and I.

In addition, the quantum dot is a nano crystal particle having a core and a shell. The core of the quantum dot has a size ranging from 2 nm to 100 nm. By adjusting the size of the core, the quantum dot may be used as a phosphor material which emits various colors, such as blue (B), yellow (Y), green (G), and red (R). The core-shell structure constituting the quantum dot may be formed by a heterojunction of at least two kinds of semiconductors selected from group II-VI compound semiconductors (ZnS, ZnSe, ZnTe, CdS, CdSe, CdTe, HgS, HgSe, HgTe, MgTe, etc.), group III-V compound semiconductors (GaN, GaP, GaAs, GaSb, InN, InP, InAs, InSb, AlAs, AlP, AlSb, AlS, etc.), or group IV semiconductors (Ge, Si, Pb, etc.). In this case, an organic ligand using a material such as oleic acid may be formed in the outer shell of the quantum dot in order to terminate the molecular bond of the shell surface, to suppress the agglomeration of the quantum dot, to improve the dispersion within a resin, such as silicon resin or an epoxy resin, or to improve the function of the phosphor.

Meanwhile, since there exists blue light which is not converted by the red and green light conversion parts 109R and 109G and passes through the red and green light conversion parts 109R and 109G, the red or green light conversion part 109R or 109G may be formed on the entire light emitting surface of the light emitting cell C. However, in order to improve a color rendering index or obtain white light having a low color temperature, the light conversion parts may not be formed on a light emitting surface of a part of the light emitting cells (for example, C2 of FIG. 2). The number or arrangement of the red and green light conversion parts 109R and 109G may be appropriately determined using a binning technique according to a color temperature and a color rendering index required in the device. As such, in this embodiment, the single device can emit red light, green light, and blue light and the number and arrangement thereof can be adjusted as necessary. Thus, the semiconductor light emitting device according to the embodiment of the present invention is suitable for applying to an illumination apparatus such as an emotional illumination apparatus.

Figure 5:
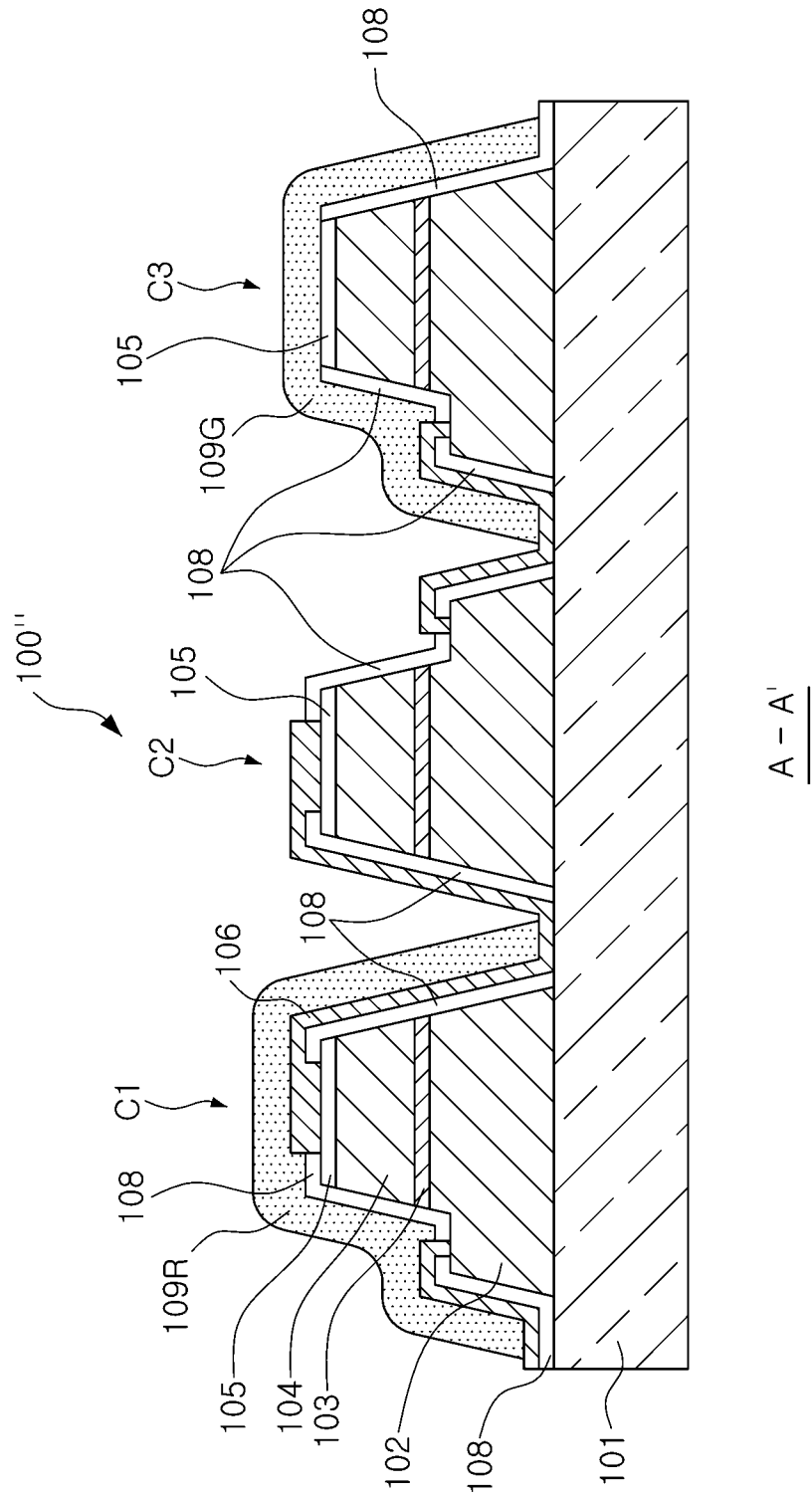
FIG. 5 is a schematic cross-sectional view illustrating an interconnection structure of light emitting cells which can be employed in another modification of the semiconductor light emitting device of FIG. 1.
Figure 6:
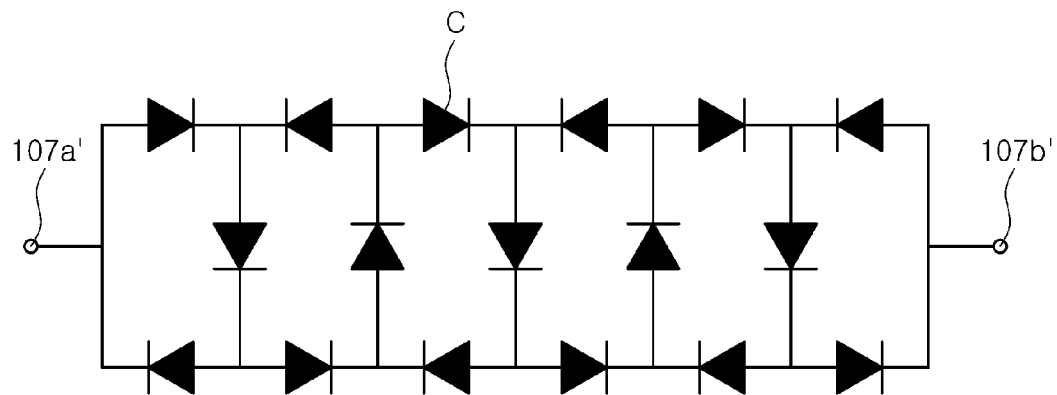
FIG. 6 is an equivalent circuit diagram illustrating an AC-driven device which can be obtained by the interconnection structure of FIG. 5.

FIG. 5 is a schematic cross-sectional view illustrating an interconnection structure of light emitting cells which can be employed in another modification of the semiconductor light emitting device of FIG. 1, and FIG. 6 is an equivalent circuit diagram illustrating an AC-driven device which can be obtained by the interconnection structure of FIG. 5. In the embodiment of FIG. 1, the light emitting cells are electrically connected in series. Specifically, the connection of the light emitting cells corresponds to an n-p connection. However, as illustrated in FIG. 5, the second-conductivity-type semiconductor layer 104 of the first light emitting cell C1 may be electrically connected to the second-conductivity-type semiconductor layer 104 of the second light emitting cell C2, and the first-conductivity-type semiconductor layer 102 of the second light emitting cell C2 may be electrically connected to the first-conductivity-type semiconductor layer 102 of the third light emitting cell C3. Such a connection corresponds to a connection of the semiconductor layers having the same polarity (p-p connection or n-n connection). Such an interconnection structure can implement an AC-driven device as illustrated in FIG. 6. The circuit of FIG. 6 is a so-called ladder network circuit in which eleven light emitting cells can emit light with respect to electric signals which are provided in a forward direction and a reverse direction.

Figure 7:
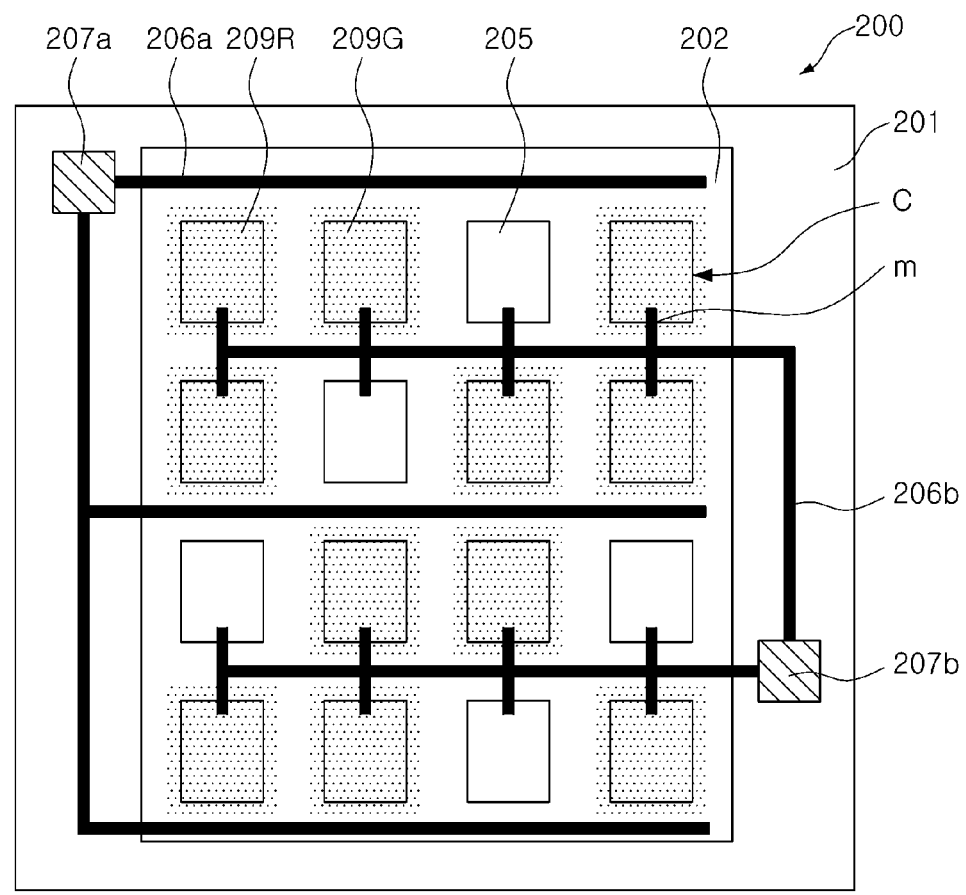
FIG. 7 is a schematic plan view illustrating a semiconductor light emitting device according to another embodiment of the present invention.
Figure 8:
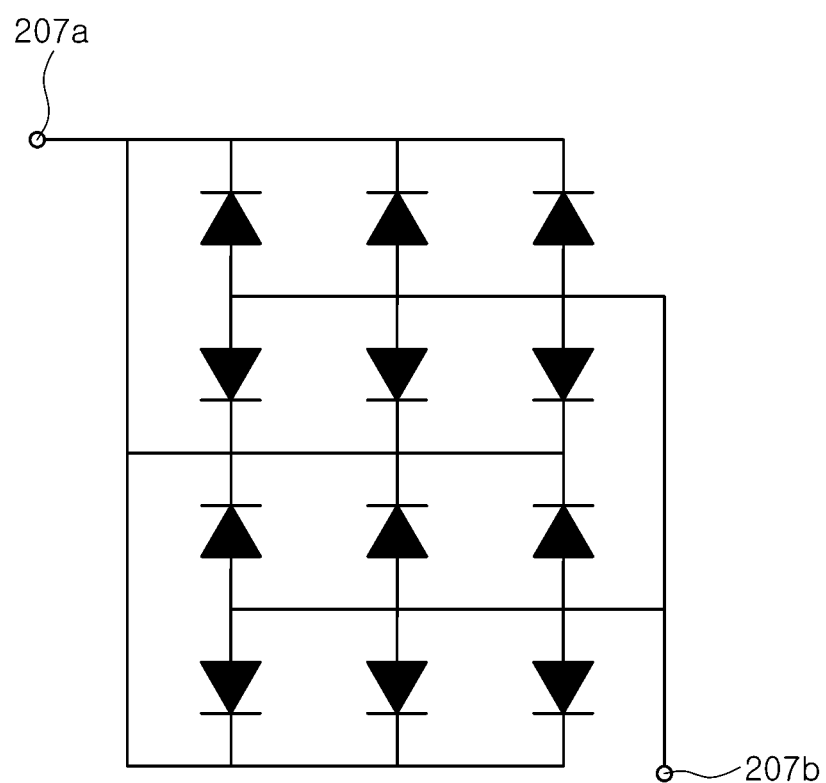
FIG. 8 is an equivalent circuit diagram illustrating a connection of light emitting cells in the semiconductor light emitting device of FIG. 7.
Figure 9:
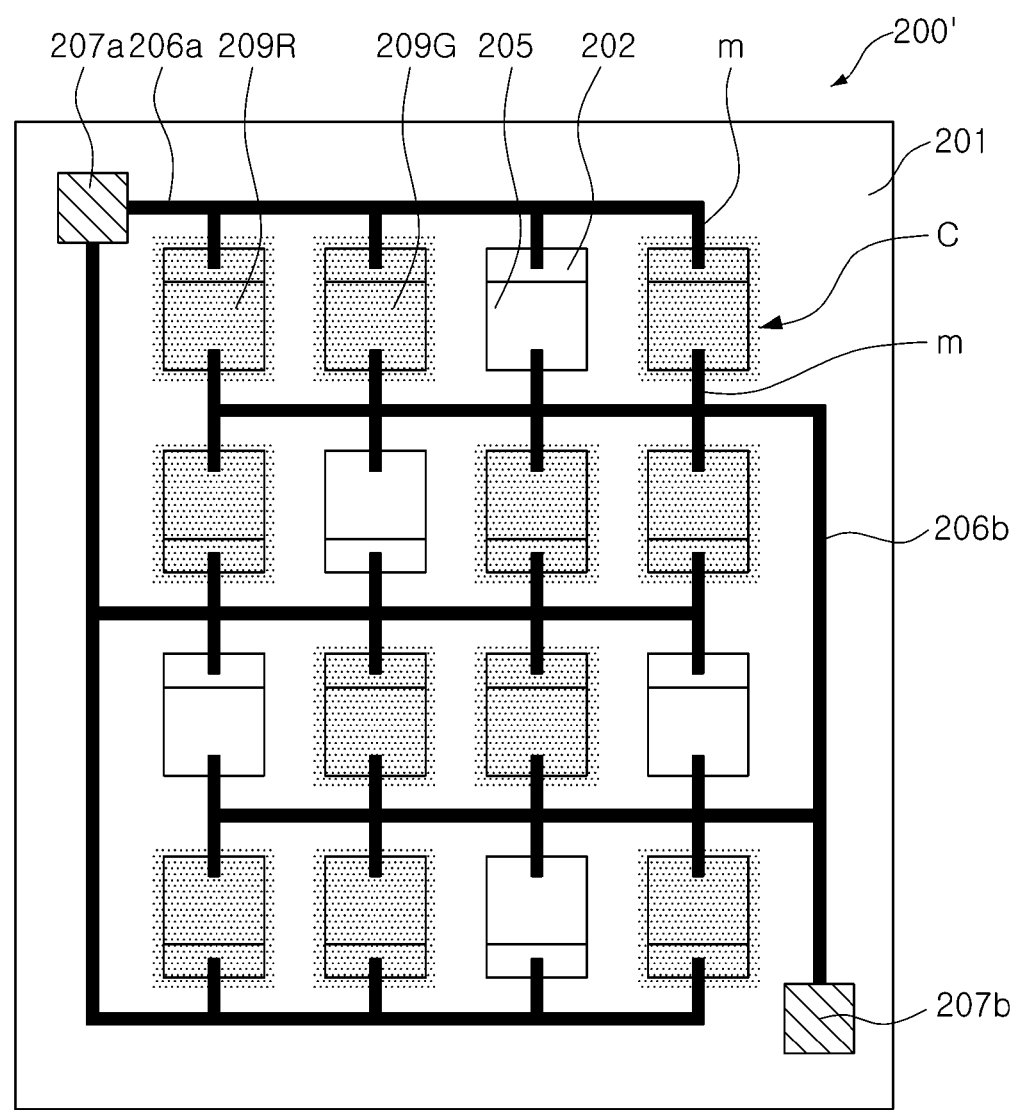
FIG. 9 is a schematic plan view illustrating a modification of the semiconductor light emitting device of FIG. 7.

FIG. 7 is a schematic plan view illustrating a semiconductor light emitting device according to another embodiment of the present invention. FIG. 8 is an equivalent circuit diagram illustrating a connection of light emitting cells in the semiconductor light emitting device of FIG. 7. FIG. 9 is a schematic plan view illustrating a modification of the semiconductor light emitting device of FIG. 7.

Referring to FIG. 7, the semiconductor light emitting device 200 according to the embodiment of the present invention includes sixteen light emitting cells C on a substrate 201. The sixteen light emitting cells C are arranged in a 4×4 pattern. In this case, the number and arrangement of the light emitting cells C may be modified. As in the foregoing embodiment, a red light conversion part 209R is formed at a portion of a light emitting region formed by the plurality of light emitting cells C, and a green light conversion part 209G may be formed at a portion of the others. Accordingly, light emitted from the red and green light conversion parts 209R and 209G and blue light emitted from the light emitting cell C in which the red and green light conversion parts 209R and 209G are not formed may be mixed to emit white light.

First and second pads 207a and 207b are formed in other regions on the substrate 201 and electrically connected to a first-conductivity-type semiconductor layer 202 and a second-conductivity-type semiconductor layer of the light emitting cells C. In FIG. 7, the second-conductivity-type semiconductor layer is not illustrated, and a transparent electrode 205 formed thereon is illustrated. In this embodiment, the light emitting cells C are configured to share the first-conductivity-type layer 202. That is, upon separation based on the light emitting cells C, the first-conductivity-type semiconductor layer 202 is not separated and it may be integrally formed over the entirety of the light emitting cells C. A first interconnection structure 206a connected to the first pad 207a extends from the first pad 207b such that it is connected to the first-conductivity-type semiconductor layer 202. Likewise, a second interconnection structure 206b connected to the second pad 207b extends from the second pad 207b such that it is connected to the second-conductivity-type semiconductor layer. A connection part m may be formed to connect the second-conductivity-type semiconductor layers of the adjacent light emitting cells C. In this case, although not illustrated in FIG. 7, since the second interconnection structure 206b and the connection part m need to be electrically separated from the first-conductivity-type semiconductor layer 202 or the active layer, an insulation material or an air bridge structure may be disposed therebetween.

As illustrated in FIG. 8, due to such an electrical connection structure, the sixteen light emitting cells C are connected in parallel. Such a parallel connection structure may be useful as a high-power light source under a DC voltage. The semiconductor light emitting device 200' of FIG. 9 is similar to the embodiment of FIG. 1 in that the first-conductivity-type semiconductor layers 202 are provided to the individual light emitting cells C, but the electrical connection structure thereof corresponds to the parallel connection structure of FIG. 7. The first interconnection structure 206a extending from the first pad 207a is not directly connected to the light emitting cell C but is connected to the first-conductivity-type semiconductor layer 202 of the light emitting cell C through the connection part m.

Figure 10:
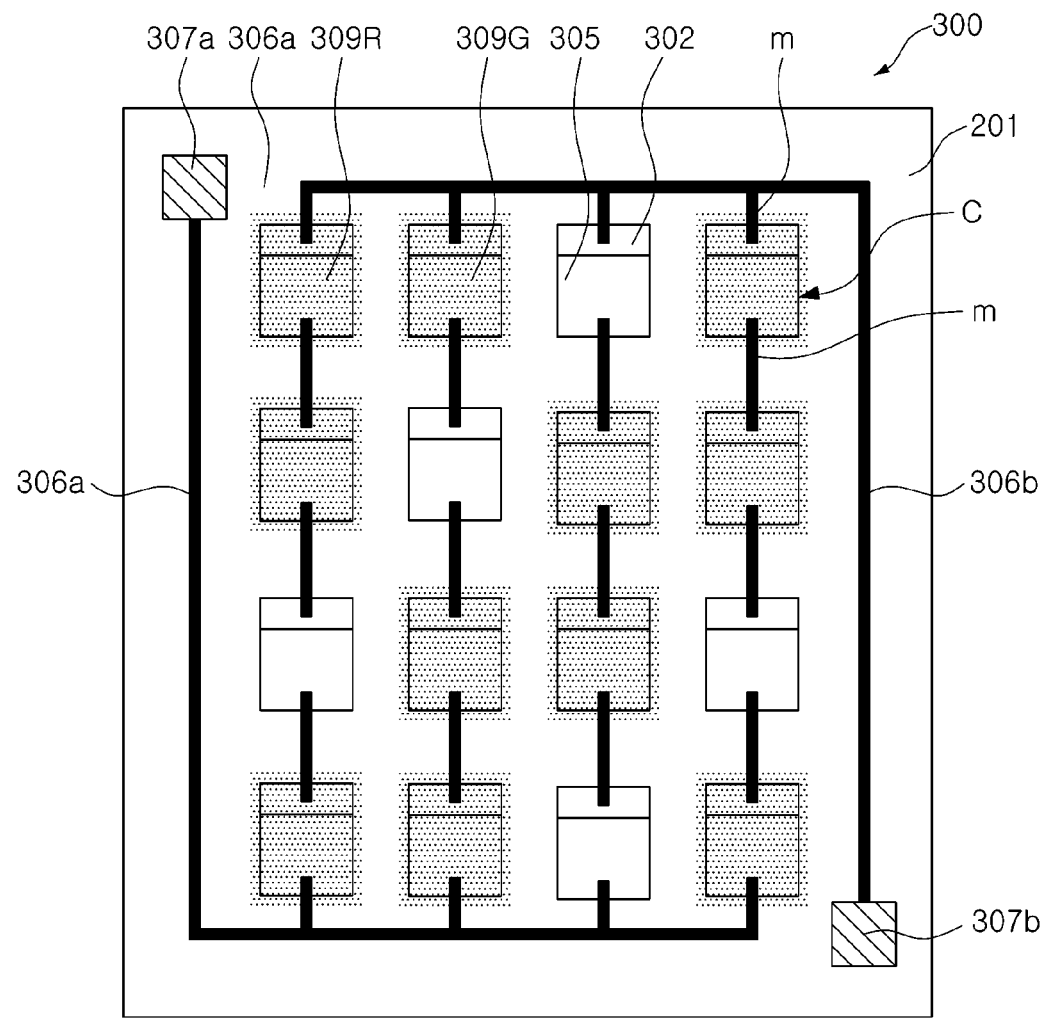
FIG. 10 is a schematic plan view illustrating a semiconductor light emitting device according to another embodiment of the present invention.
Figure 11:
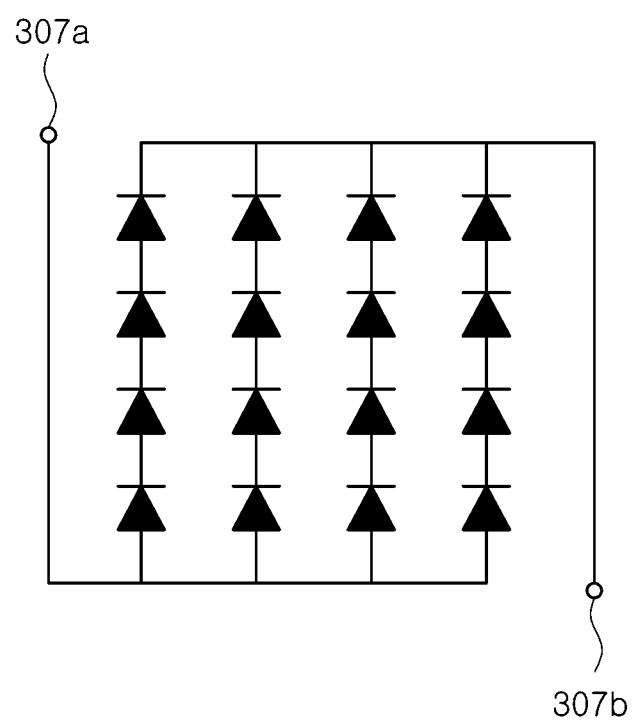
FIG. 11 is an equivalent circuit diagram illustrating a connection of light emitting cells in the semiconductor light emitting device of FIG. 10.

FIG. 10 is a schematic plan view illustrating a semiconductor light emitting device according to another embodiment of the present invention, and FIG. 11 is an equivalent circuit diagram illustrating a connection of light emitting cells in the semiconductor light emitting device of FIG. 10.

Referring to FIG. 10, the semiconductor light emitting device 300 according to the embodiment of the present invention includes sixteen light emitting cells C on a substrate 301. The sixteen light emitting cells C are arranged in a 4×4 pattern. In this case, the number and arrangement of the light emitting cells C may be modified. As in the foregoing embodiment, a red light conversion part 309R is formed at a portion of a light emitting region formed by the plurality of light emitting cells C, and a green light conversion part 309G may be formed at a portion of the others. Accordingly, light emitted from the red and green light conversion parts 309R and 309G and blue light emitted from the light emitting cell C in which the red and green light conversion parts 309R and 309G are not formed may be mixed to emit white light. In this embodiment, first and second pads 307a and 307b are formed in other regions on the substrate 301 and electrically connected to a first-conductivity-type semiconductor layer 302 and a second-conductivity-type semiconductor layer of the light emitting cells C. In FIG. 10, the second-conductivity-type semiconductor layer is not illustrated, and a transparent electrode 305 formed thereon is illustrated. That is, a first interconnection structure 306a connected to the first pad 307a is connected to the second-conductivity-type semiconductor layer provided in a part of the light emitting cells C. Likewise, a second interconnection structure 306b connected to the second pad 307b is connected to the first-conductivity-type semiconductor layer of a part of the other light emitting cells C. The other light emitting cells C which are not directly connected to the first and second interconnection structures 306a and 306b are connected in series by a connection structure m. Accordingly, as illustrated in FIG. 11, a structure in which the series connection and the parallel connection are mixed may be obtained.

Figure 12:
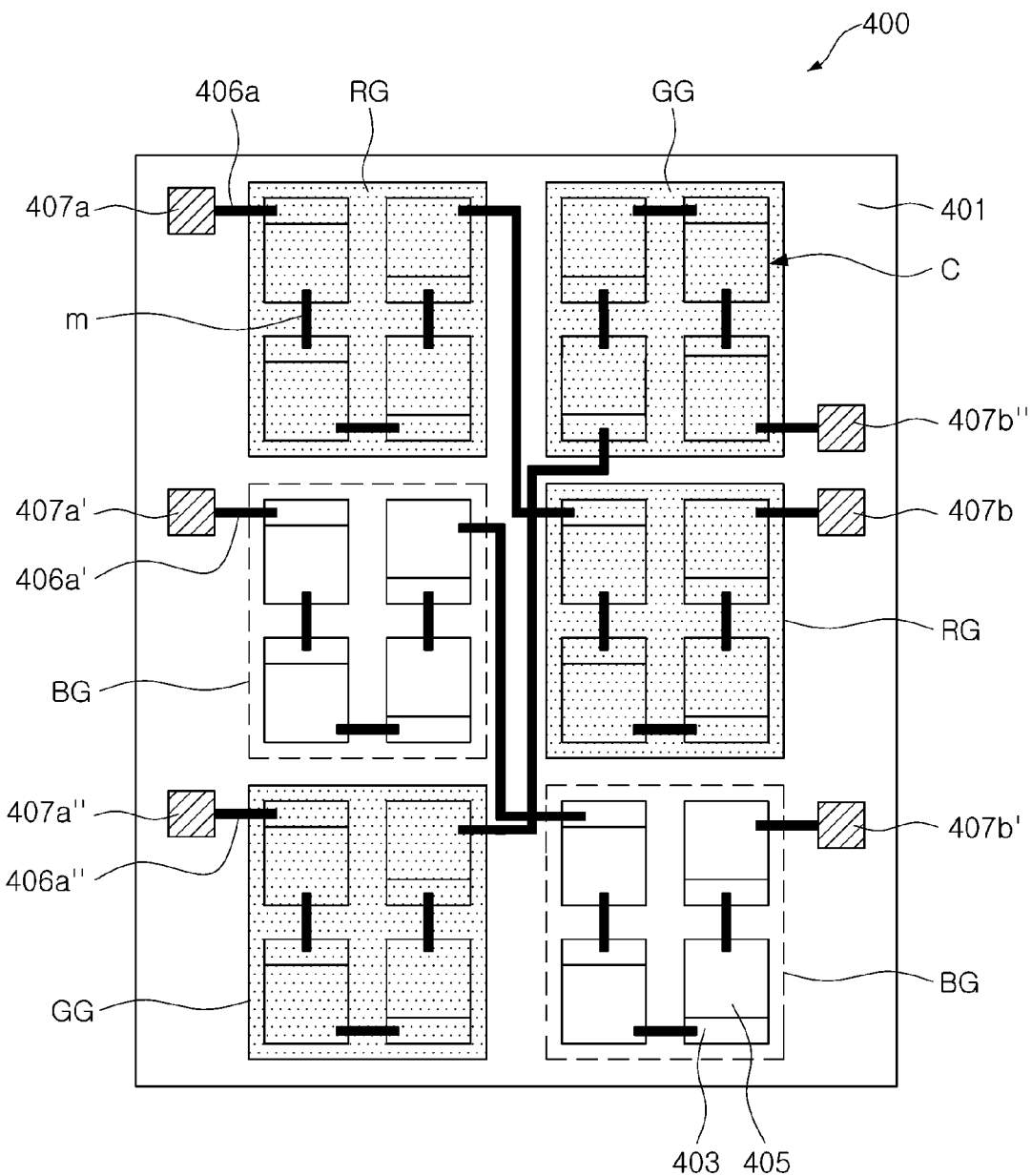
FIG. 12 is a schematic plan view illustrating a semiconductor light emitting device according to another embodiment of the present invention.
Figure 13:
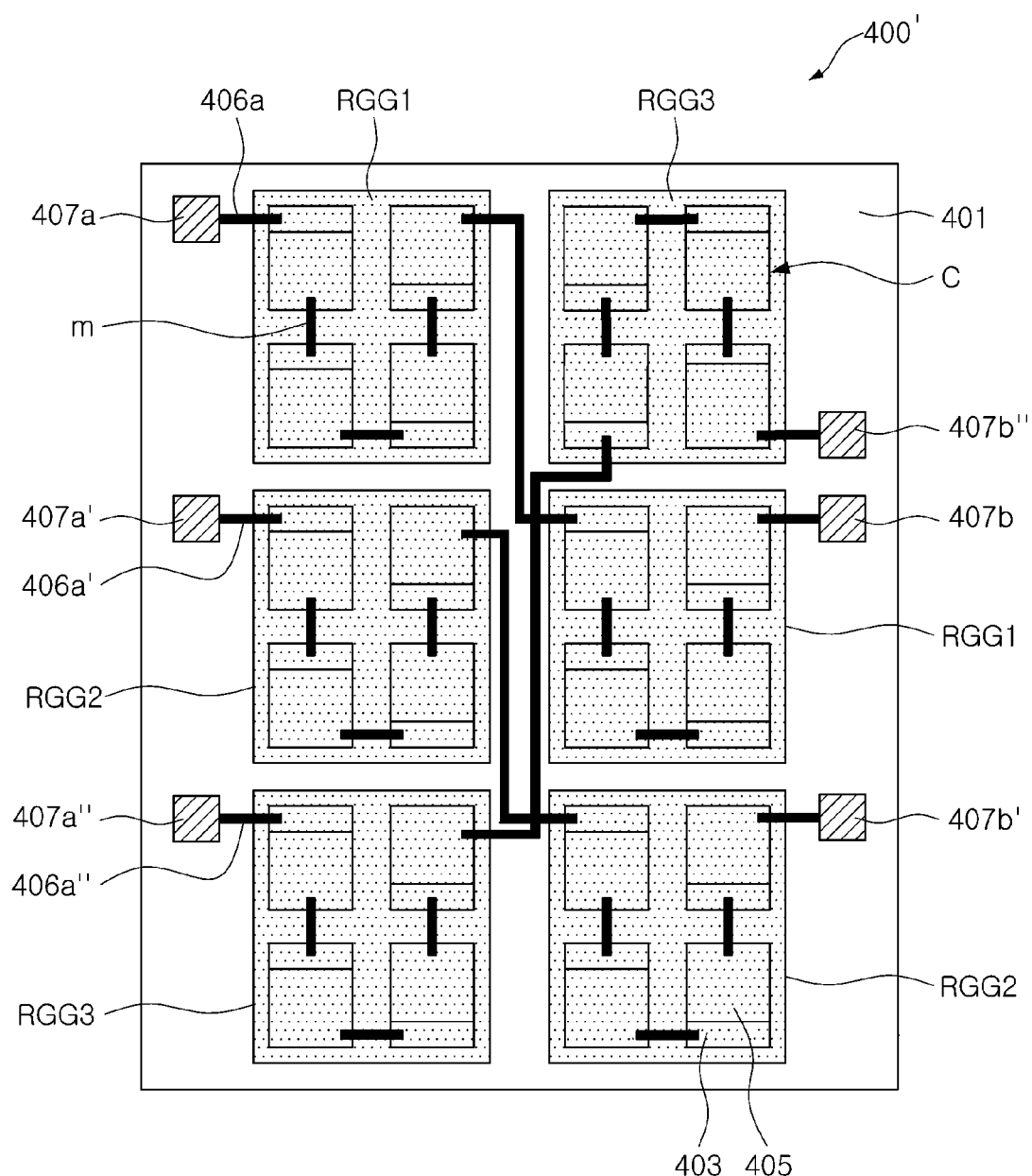
FIG. 13 is a schematic plan view illustrating a light emitting device according to another embodiment of the present invention.
Figure 30:
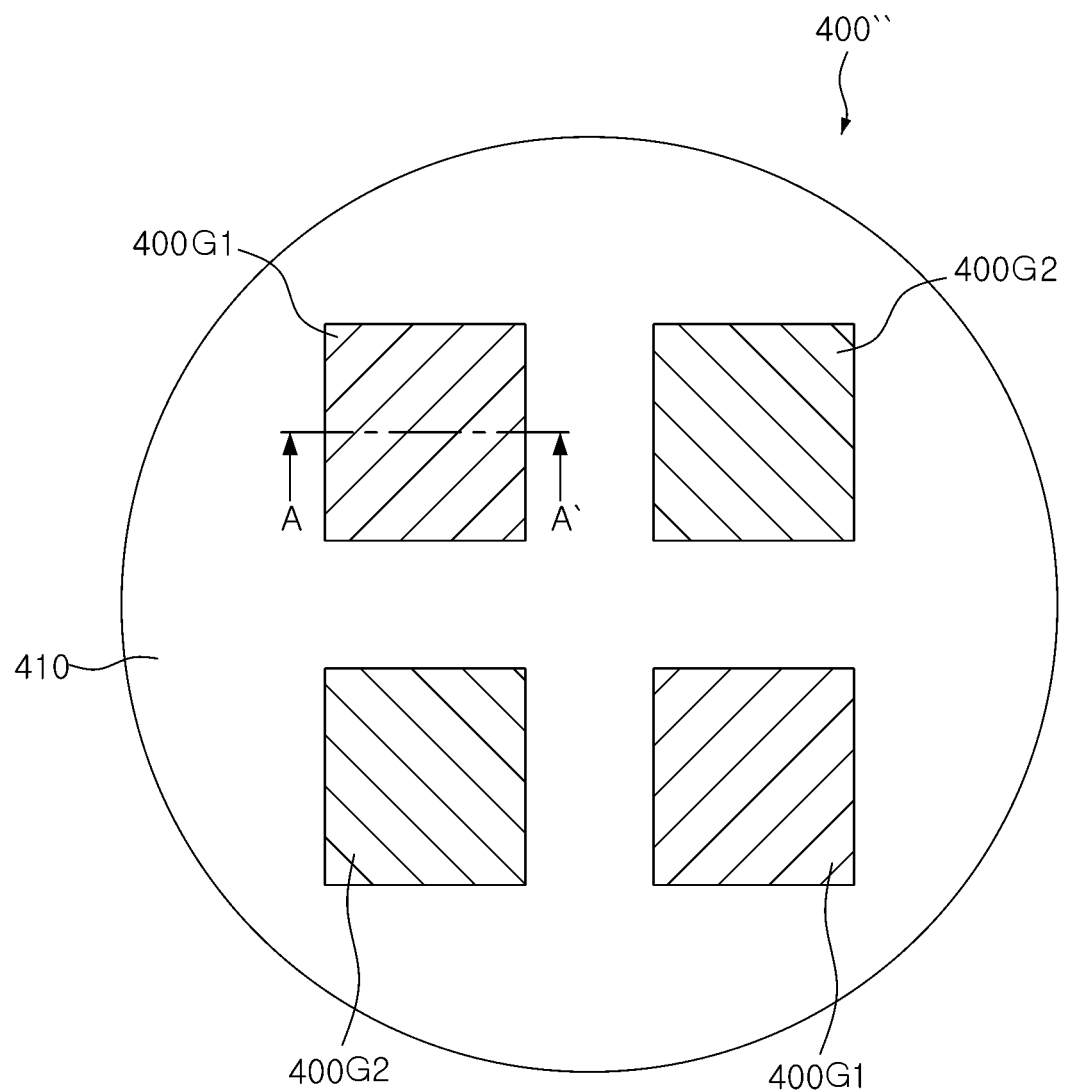
FIG. 30 is a schematic plan view illustrating a semiconductor light emitting device according to another embodiment of the present invention.
Figure 31:
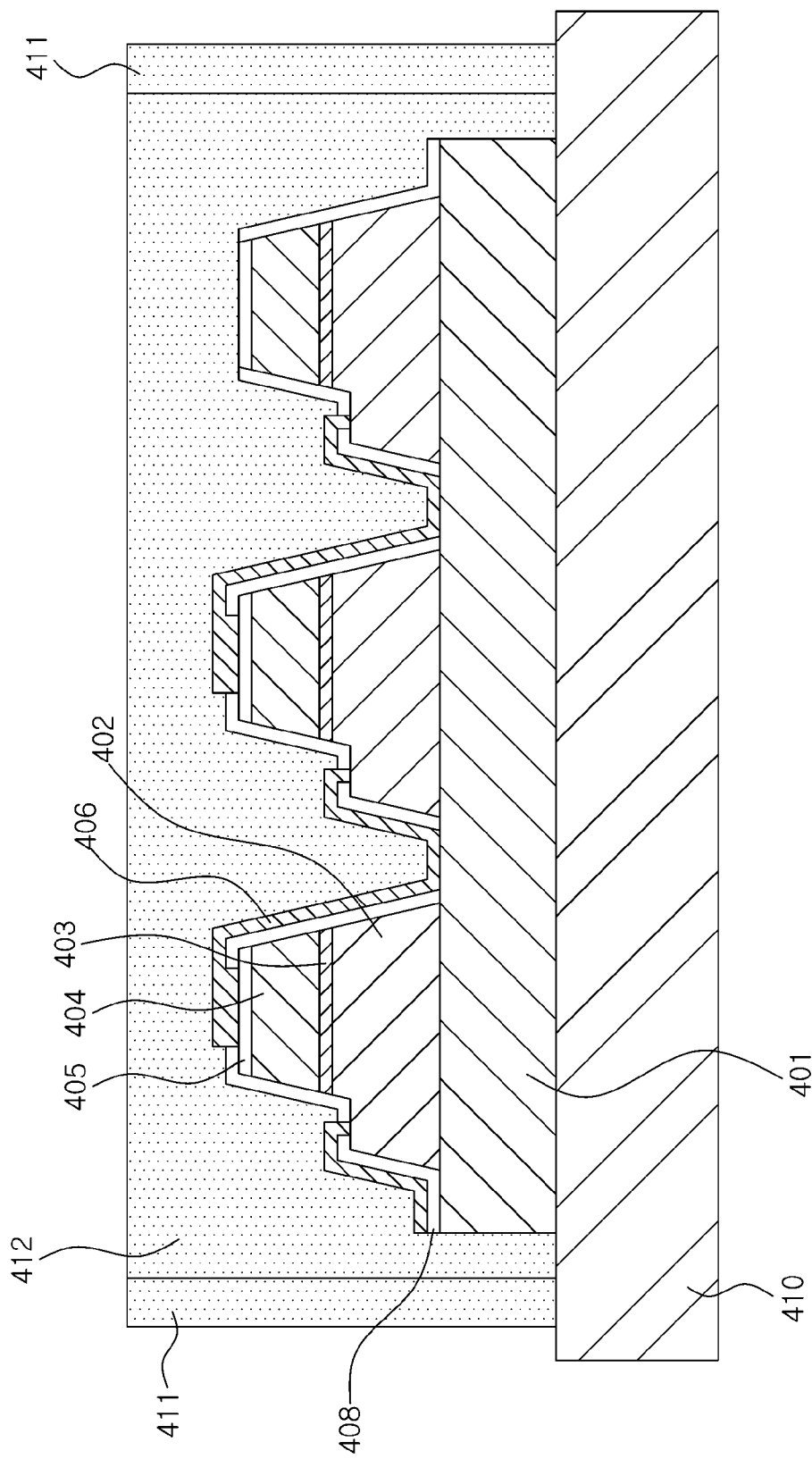
FIG. 31 is a schematic cross-sectional view taken along line A-A' in the semiconductor light emitting device of FIG. 30.

FIGS. 12, 13 and 30 are schematic plan views illustrating semiconductor light emitting devices according to other embodiments of the present invention. FIG. 31 is a schematic cross-sectional view taken along line A-A' of FIG. 30.

In the embodiment of FIG. 12, the semiconductor light emitting device 400 includes twenty-four light emitting cells C on a substrate 401. The twenty-four light emitting cells C are arranged in a 4×6 pattern. The plurality of light emitting cells C are divided into three groups: a red group RG, a green group GG, and a blue group BG. A red light conversion material covering the light emitting cells C is formed in a light emitting region corresponding to the red group RG. A green light conversion material covering the light emitting cells C is formed in a light emitting region corresponding to the green group GG. A light conversion material is not formed in a light emitting region corresponding to the blue group BG. Each of the red group RG, the green group GG, and the blue group BG includes eight light emitting cells C, and a series connection structure is formed therebetween. However, the number or electrical connection of the light emitting cells C may be appropriately modified. For example, the cells within single group RG, GG or BG may form a parallel structure or a series-parallel structure. As illustrated in FIG. 12, in order to uniformly mix different colored light, the red group RG, the green group GG, and the blue group BG may be separately arranged in a plurality of regions so that they are mixed with other groups, instead of being arranged to have the same kinds of groups in a single region. In this case, the connection structures m of the light emitting cells C belonging to different groups may be arranged to overlap one another. To this end, an insulation material or an air bridge structure may be provided between the connection structures m of the corresponding region.

In this embodiment, the semiconductor light emitting device 400 includes three pairs of pads. Specifically, first and second pads 407a and 407b connected to the red group RG, first and second pads 407a' and 407b' connected to the blue group BG, and first and second pads 407a" and 407b" connected to the green group GG are arranged on the substrate 401. Currents applied through the three pairs of the pads to the red group RG, the green group GG, and the blue group BG may be independently controlled. Accordingly, an amount of light emitted from each group may be controlled by adjusting the intensity of the currents applied to the red group RG, the green group GG, and the blue group BG. Hence, the color temperature and the color rendering index of white light may be changed to a desired level. For example, warm white light may be obtained by relatively increasing the intensity of the light emitted from the red group RG. In a similar manner, cool white light may be obtained by relatively increasing the intensity of the light emitted from the blue group BG. In addition, other colors except for white light may be implemented by the by-group current control method. The semiconductor light emitting device according to the embodiment of the present invention may be used in an emotional illumination apparatus.

In the embodiment of FIG. 13, the semiconductor light emitting device 400' includes twenty-four light emitting cells C on a substrate 401. The twenty-four light emitting cells C are arranged in a 4×6 pattern in a similar manner to the embodiment of FIG. 12. However, the plurality of light emitting cells C are divided into three groups RGG1, RGG2, and RGG3, and a mixture of red and green light conversion materials covering the light emitting cells C are formed in light emitting regions corresponding to the respective groups RGG1, RGG2 and RGG3. That is, in this embodiment, the light conversion part applied to the single group includes two or more light conversion materials, for example, red and green light conversion materials. In this case, a mixture ratio of at least one of the red and green light conversion materials in at least one of the groups RGG1, RGG2 and RGG3 is different from that of the others. Accordingly, different colored light may be mixed. In this case, the single light conversion part may include another material as well as the red and green color light conversion materials. For example, the light conversion part may include red, green and blue light conversion materials. Accordingly, the quality of white light may be further improved.

As in the embodiment of FIG. 12, each of the groups RGG1, RGG2 and RGG3 includes eight light emitting cells C, and a series connection structure is formed therebetween. However, the number or electrical connection of the light emitting cells C may be appropriately modified. As illustrated in FIG. 13, in order to uniformly mix different colored light, the plurality of groups RGG1, RGG2 and RGG3 may be separately arranged in a plurality of regions so that they are mixed with other groups, instead of arranging the same kinds of the groups in a single region. In this case, the connection structures m of the light emitting cells C belonging to different groups may be arranged to overlap one another. To this end, an insulation material or an air bridge structure may be provided between the connection structures m of the corresponding region. In addition, three pairs of pads are provided on the substrate 401. Specifically, first and second pads 407*a* and 407*b* connected to the first group RRG1, first and second pads 407*a*' and 407*b*' connected to the second group RGG2, and first and second pads 407*a*" and 407*b*" connected to the third group RGG3 are arranged on the substrate 401. Currents applied through the three pairs of the pads to the plurality of groups RGG1, RGG2 and RGG3 may be independently controlled. Accordingly, the color temperature and the color rendering index of white light may be changed to a desired level. As in this embodiment, the color temperature and the color rendering index may be controlled more precisely in such a way that the currents applied to the respective groups RGG1, RGG2 and RGG3 are independently controlled by mixing two or more light conversion materials and differently applying the mixture ratios of the light conversion materials to the respective groups RGG1, RGG2 and RGG3.

Meanwhile, although it has been described in the embodiments of FIGS. 12 and 13 that the color temperature of white light is controlled within the single multi-chip, the color temperature of white light may also be controlled at a package level. In the embodiments of FIGS. 30 and 31, the semiconductor light emitting device 400" includes a plurality of multi-chip devices 400G1 and 400G2 arranged on a package substrate 410. As illustrated in FIG. 31, each of the multi-chip devices 400G1 and 400G2 has a structure in which a plurality of light emitting cells are connected together. In this case, each of the multi-chip devices 400G1 and 400G2 may form the same light emitting cell connection structure as described in the previous embodiment. That is, the multi-chip devices 400G1 and 400G2 have a structure in which the plurality of light emitting cells are arranged on the substrate 401, and each of the light emitting cells includes a first-conductivity-type semiconductor layer 402, an active layer 403, a second-conductivity-type semiconductor layer 404, and a transparent electrode 405. In addition, the interconnection structure 406 is not a wire and is formed along the surfaces of the light emitting cells and the substrate 401, and an insulation part 408 may be disposed between the light emitting cells and the interconnection structure 406 to thereby prevent unintended electrical shorting.

In this embodiment, the multi-chip devices 400G1 and 400G2 include red and green light conversion materials having different mixture ratios, as in the embodiments of FIGS. 12 and 13. In this embodiment, the multi-chips are divided into two groups 400G1 and 400G2. Therefore, the total color temperature and color rendering index of the semiconductor light emitting device may be precisely controlled by independently adjusting the currents applied to the groups 400G1 and 400G2. Meanwhile, in this embodiment, the light conversion part includes a dam part 411. The inside of the dam part 411 is filled with a light conversion material 412. The dam part 411 may be formed by a dam and fill process. The dam and fill process is a process which forms the dam part 411 to surround the light emitting cell in the package substrate 410 or the light emitting cell substrate 401 and fills the dam part 411 with the light conversion material 412. In this embodiment, the dam part 411 may include the same material as the light conversion material 412. Furthermore, the dam part 411 itself may be formed of the same material as the filled part thereof. That is, the dam part 411 may further include a phosphor as well as a resin and a filler ($Al_2O_3$, $SiO_2$, $TiO_2$, etc.). Accordingly, a thixotropy thereof is improved to facilitate the formation of the dam. In addition, light may be emitted to the outside through the dam part 411. Moreover, since the wavelength conversion may be performed, it can be expected that light loss caused by the dam part 411 will be minimized and light efficiency and light orientation property will be improved.

Figure 14:
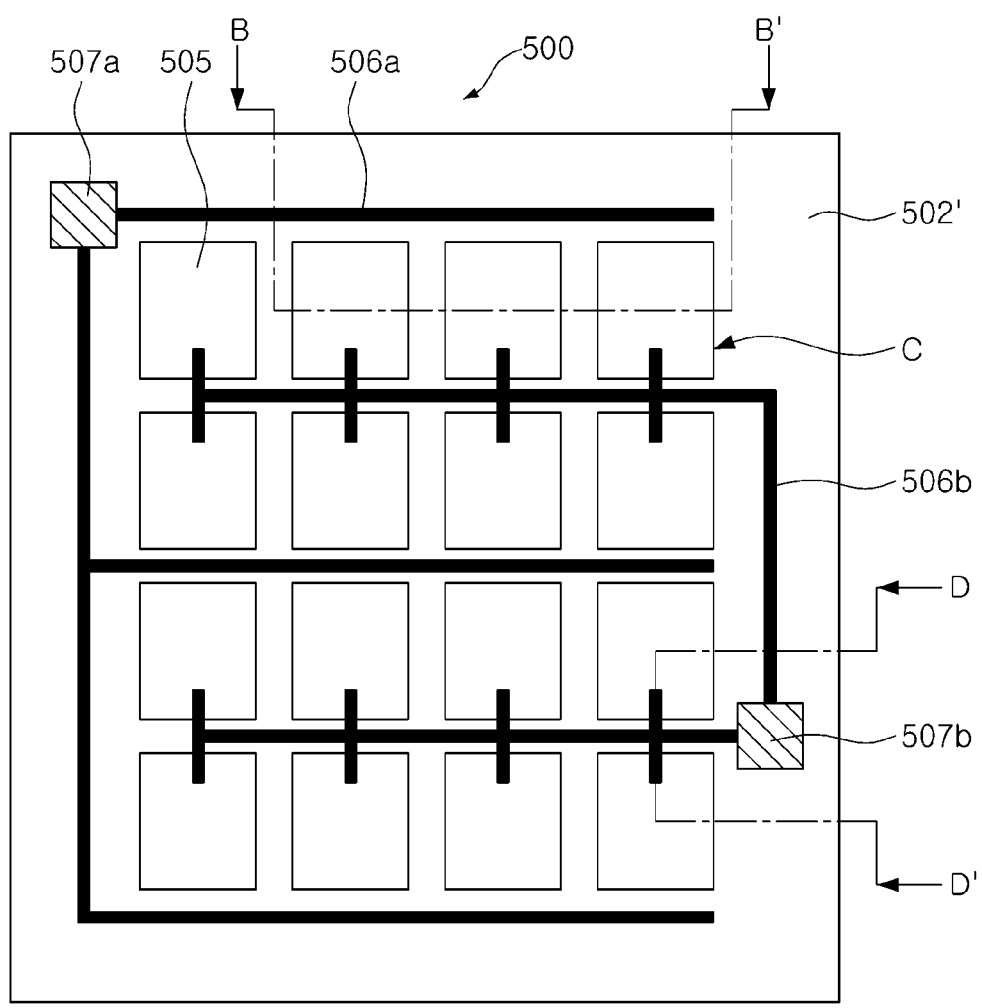
FIG. 14 is a schematic plan view illustrating a semiconductor light emitting device according to another embodiment of the present invention.
Figure 15:
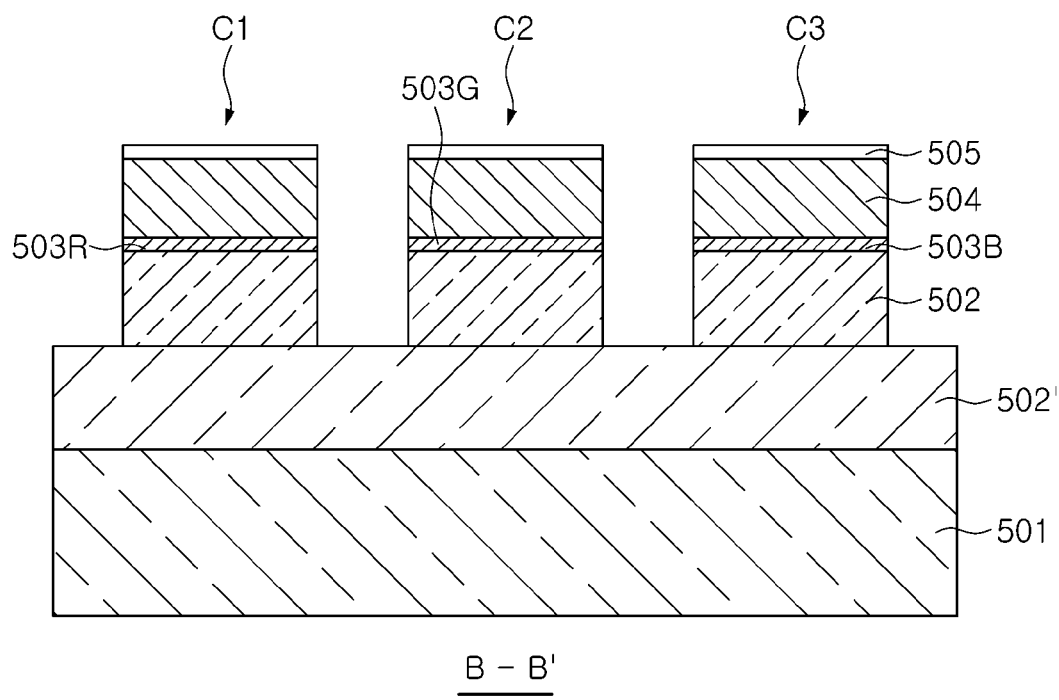
FIG. 15 is a schematic cross-sectional view taken along line B-B' of FIG. 14.
Figure 16:
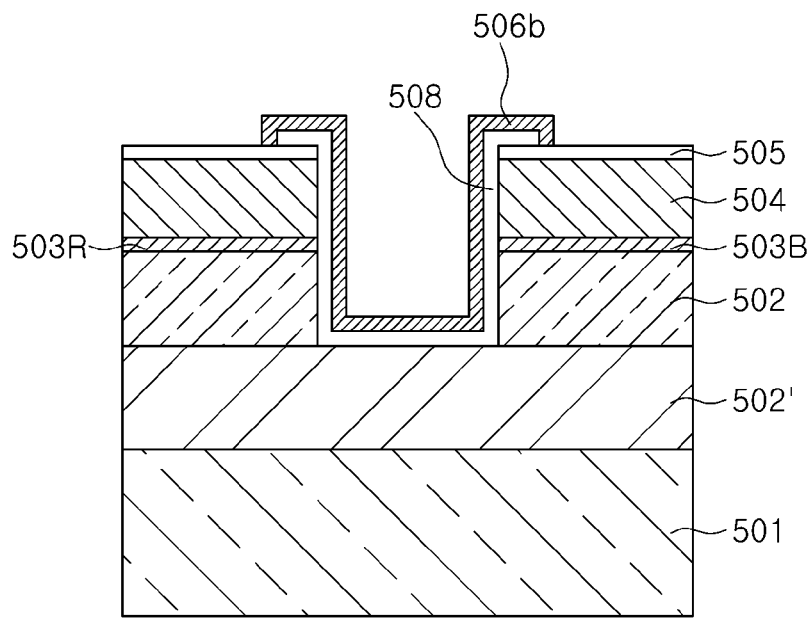
FIG. 16 is a schematic cross-sectional view taken along line D-D' of FIG. 14.

FIG. 14 is a schematic plan view illustrating a semiconductor light emitting device according to another embodiment of the present invention. FIG. 15 is a schematic cross-sectional view taken along line B-B' of FIG. 14. FIG. 16 is a schematic cross-sectional view taken along line D-D' of FIG. 15.

Referring to FIGS. 14 through 16, the semiconductor light emitting device 500 includes a plurality of light emitting cells C arranged on a substrate 501. Each of the light emitting cells C includes a first-conductivity-type semiconductor layer 502, an active layer 503, and a second-conductivity-type semiconductor layer 504. In addition, a transparent electrode 505 may be further disposed on the second-conductivity-type semiconductor layer 504. In this embodiment, a base layer 502' connecting the first-conductivity-type semiconductor layers 502 provided at the light emitting cells C is disposed between the light emitting cells and the substrate 501. The base layer 502' may be integrally formed over the entirety of the light emitting cells. The base layer 502' may be formed of a first-conductivity-type semiconductor material or an undoped semiconductor material. As will be described later, the base layer 502' may serve as a seed layer for re-growing the firstconductivity-type semiconductor layer 502. In a case in which the base layer 502' is formed of the first-conductivity-type semiconductor material, the first-conductivity-type semiconductor layer is shared by the light emitting cells C. Accordingly, the light emitting cells C are electrically connected in parallel. In this case, the active layer 503 may be grown without re-growing the first-conductivity-type semiconductor layer 502. Furthermore, in some cases, the base layer 502' may not be formed. In this case, the light emitting cells C may be directly formed on the substrate 501.

A first pad 507a is formed on the base layer 502', and a first interconnection structure 506a extends from the first pad 507a and is connected to the first-conductivity-type semiconductor layer 502. In addition, a second pad 507b is formed on the first-conductivity-type semiconductor layer 502, and a second interconnection structure 506b extends from the second pad 507b and is connected to the second-conductivity-type semiconductor layer 504. However, since the second pad 507b and the second interconnection structure 506b need to be electrically separated from the first-conductivity-type semiconductor layer 502 and the active layer 503, an insulation part 508 may be disposed therebetween. Meanwhile, although the first pad 507a and the second pad 507b are formed on the first-conductivity-type semiconductor layer 502, they may be formed similarly to the foregoing embodiment. That is, the first pad 507a and the second pad 507b may be formed in a predetermined region of the substrate 501 in which the first-conductivity-type semiconductor layer 502 is not formed.

In this embodiment, the semiconductor light emitting device 500 includes three or more kinds of light emitting cells C. A first light emitting cell C1 emits red light, a second light emitting cell C2 emits green light, and a third light emitting cell C3 emits blue light. That is, the single device can emit red light, green light, and blue light. Since the number and arrangement of the light emitting cells C can be adjusted as necessary, it is suitable for applying to an illumination apparatus such as an emotional illumination apparatus. To this end, the compositions of the active layers 503R, 503G and 503B of the first, second and third light emitting cells C1, C2 and C3 are adjusted so that the active layers 503R, 503G and 503B have different band gap energies to thereby emit different colored light. As will be described later, when the light emitting cells C1, C2 and C3 are formed by different re-growth processes, growth conditions of the active layers 503R, 503G and 503B provided at the first, second and third light emitting cells C1, C2 and C3 may be easily adjusted. In addition, since the light emitting cells C emitting the red, green and blue light are provided, the light conversion part may not be separately formed on the light emitting surfaces of the light emitting cells C. Hence, light loss caused by a phosphor or a quantum dot may be reduced.

Figure 17:
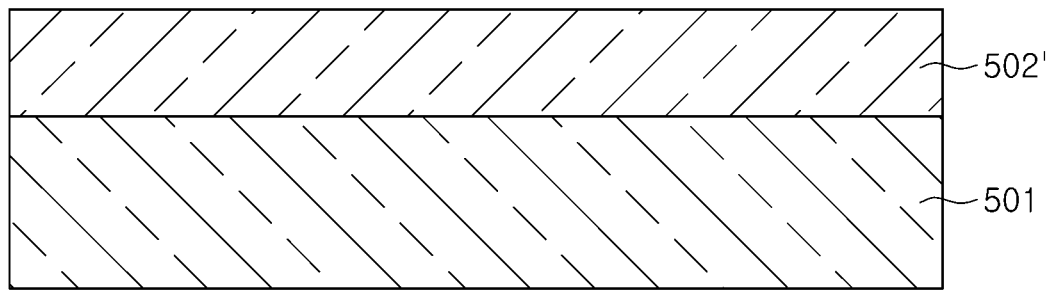
FIGS. 17 through 20 are cross-sectional views explaining a method for manufacturing the semiconductor light emitting device of FIG. 14 according to an embodiment of the present invention.

FIGS. 17 through 20 are cross-sectional views explaining a method for manufacturing the semiconductor light emitting device of FIG. 14 according to an embodiment of the present invention. As illustrated in FIG. 17, a base layer 502' is grown on a substrate 501. As described above, the base layer 502' may be formed of a first-conductivity-type semiconductor material or an undoped semiconductor material. For example, the base layer 502' may be formed of a nitride semiconductor. In this case, the base layer 502' may be formed using a semiconductor thin film growth process known in the art, such as an MOCVD process, an HVPE process, or an MBE process.

Figure 18:
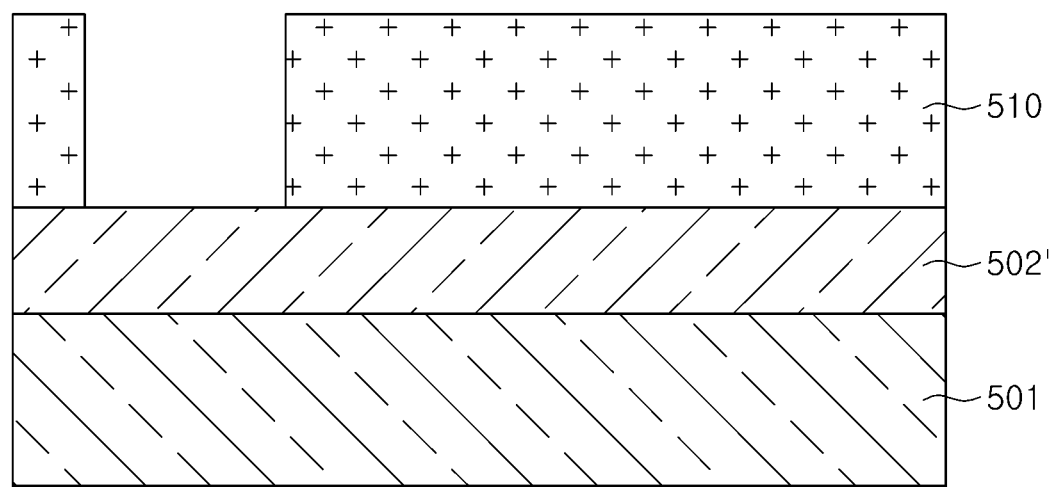
Figure 19:
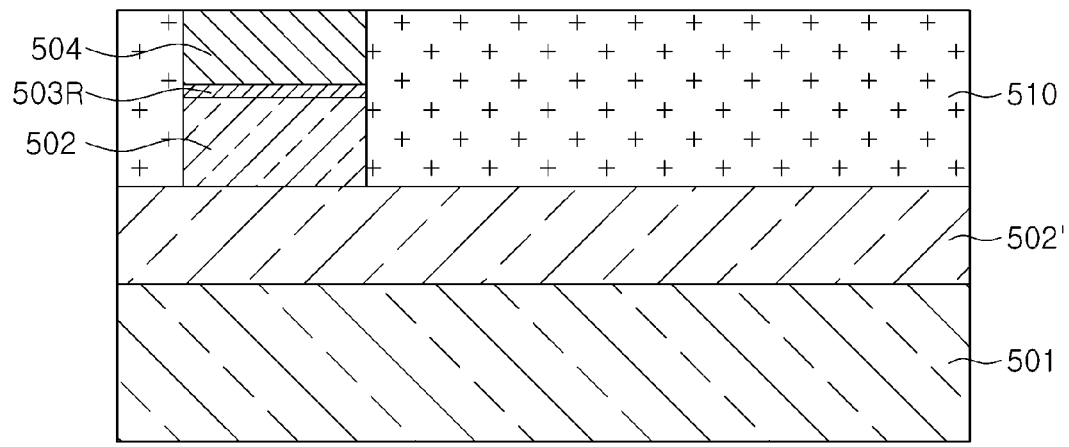

As illustrated in FIG. 18, a mask layer 510 having an open region exposing a portion of the base layer 502' is formed on the substrate 501. The open region is provided as a region for forming a light emitting cell through a re-growth process. The mask layer 510 may be formed of a material, such as silicon oxide or silicon nitride, through a deposition process or a sputtering process. In addition, the open region of the mask layer 510 may be formed using a photoresist process known in the art. As illustrated in FIG. 19, a light emitting cell is formed by sequentially growing a first-conductivity-type semiconductor layer 502, an active layer 503R, and a second-conductivity-type semiconductor layer 504 on the base layer 502 through the open region. Although the order of growth is not specifically limited, the active layer 503R emitting red light may be grown through this growth process.

Figure 20:
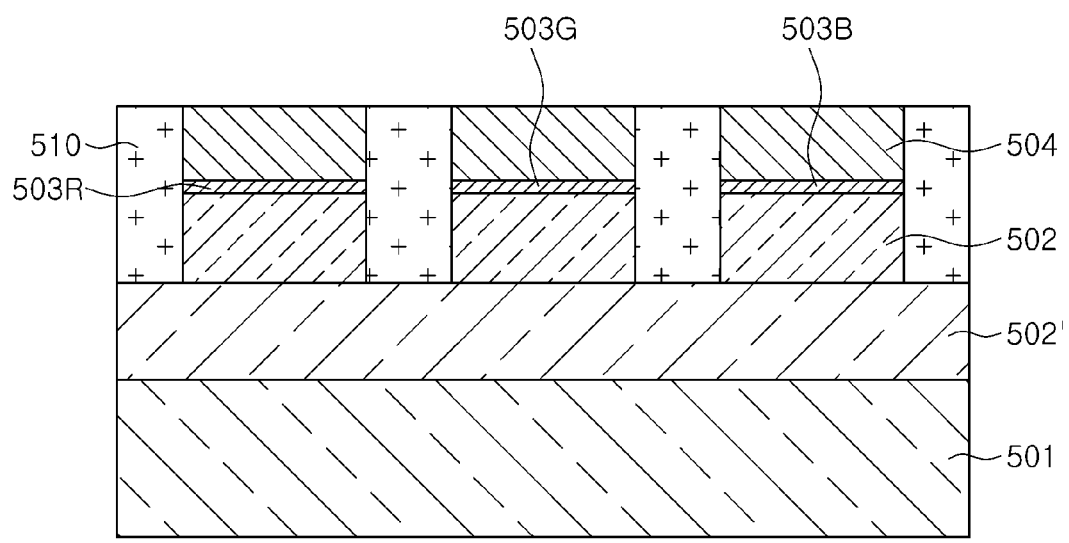

As illustrated in FIG. 20, another open region is formed in the mask layer 510. a light emitting cell including a first-conductivity-type semiconductor layer 502, an active layer 503G emitting green light, and a second-conductivity-type semiconductor layer 504 is formed on the base layer 502'. A light emitting cell including a first-conductivity-type semiconductor layer 502, an active layer 503B emitting blue light, and a second-conductivity-type semiconductor layer 504 is formed on the base layer 502'. In this step, the light emitting cells may be independently arranged without contacting one another. Although not illustrated, a transparent electrode may be formed on the second-conductivity-type semiconductor layer 504. An interconnection structure is formed to electrically connect the light emitting cells, thereby obtaining a structure of FIG. 14. In the above-described method for manufacturing the semiconductor light emitting device, an etching process is not used for separation into the light emitting cells C. Instead, the re-growth of the semiconductor layer is used to spontaneously separate the light emitting cells. In addition, the first-conductivity-type semiconductor layer 502 may not be etched in order to connect the interconnection structure to the first-conductivity-type layer 502. Accordingly, it is possible to prevent the damage of the light emitting cells C which is caused during the etching process. Since the area of the active layer 503 is sufficiently ensured, the luminous efficiency of the semiconductor light emitting device can be improved.

Figure 32:
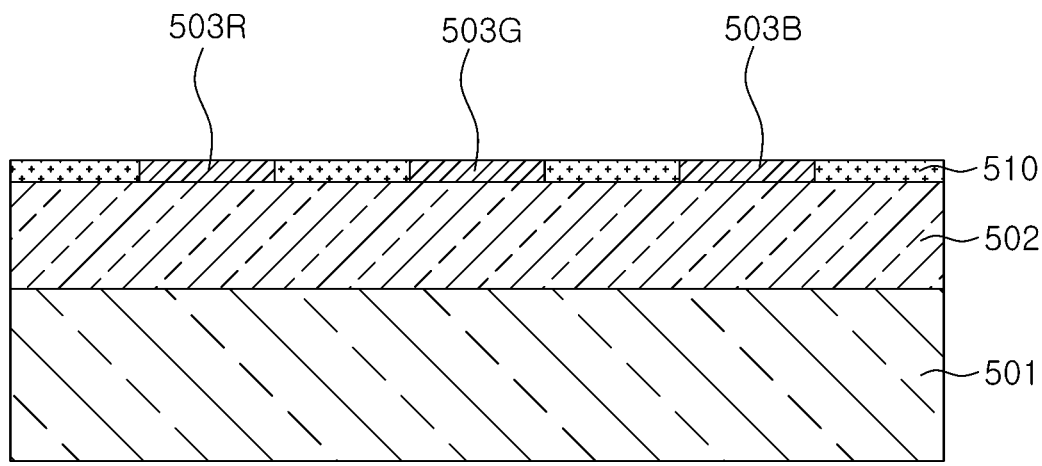
FIGS. 32 through 34 are cross-sectional views explaining a method for manufacturing a semiconductor memory device according to another embodiment of the present invention.
Figure 33:
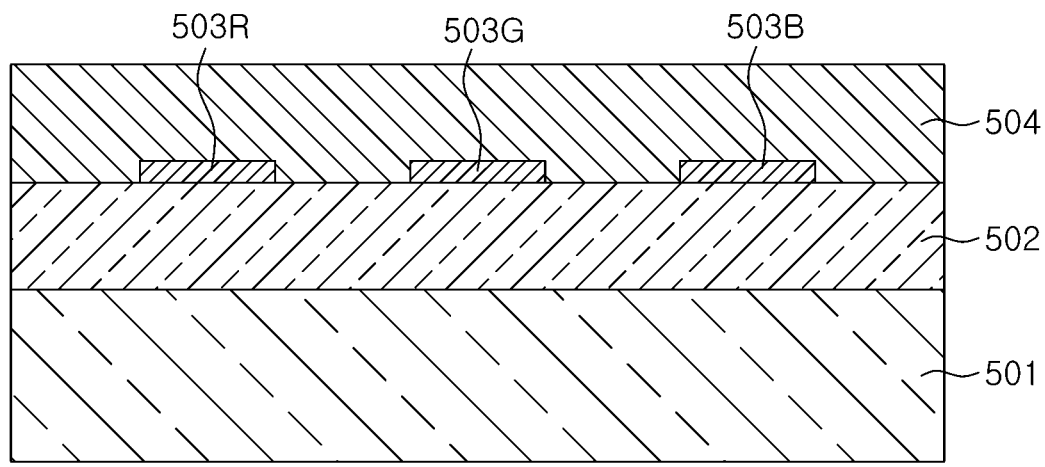
Figure 34:
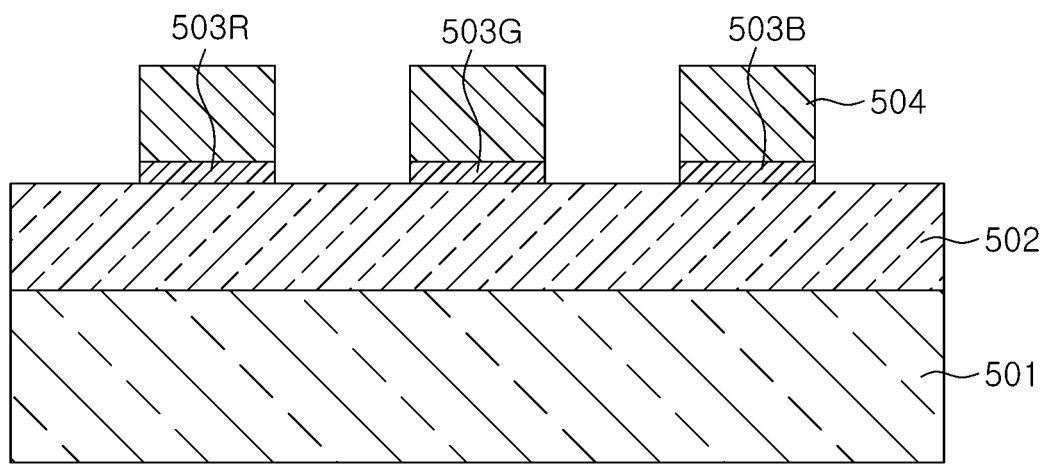

FIGS. 32 through 34 are cross-sectional views explaining a method for manufacturing a semiconductor memory device according to another embodiment of the present invention. As illustrated in FIG. 32, a first-conductivity-type semiconductor layer 502 is grown on a substrate 501, and first to third active layers 503R, 503B and 503G are formed in first to third regions of the first-conductivity-type semiconductor layer 502. As in the foregoing embodiment, the first to third active layers 503R, 503B and 503G emit red light, blue light, and green light, respectively. In this case, the first to third active layers 503R, 503B and 503G may be grown using a mask layer 510 with an open region having an appropriate shape. As illustrated in FIG. 33, a second-conductivity-type semiconductor layer 504 is grown to cover the first to third active layers 503R, 503B and 503G. The second-conductivity-type semiconductor layer 504 may be integrally formed while covering the top and side surfaces of the first to third active layers 503R, 503B and 503G.

As illustrated in FIG. 34, a light emitting structure (light emitting cell) separating process is performed. That is, first to third light emitting structures are formed by removing a portion of the second-conductivity-type semiconductor layer 504 so that the second-conductivity-type semiconductor layer 504 corresponding to positions of the first to third active layers 503R, 503B and 503G is left. In this case, as illustrated in FIG. 34, the first-conductivity-type semiconductor layer 502 may not be removed. Accordingly, the light emitting structures may be connected in parallel. Alternatively, in order to apply another connection structure, a portion of the first-conductivity-type semiconductor layer 502 may be removed so that the first-conductivity-type semiconductor layer 502 corresponding to the positions of the first to third active layers 503R, 503B and 503G is left. Although not illustrated, a multi-chip device can be implemented by forming an appropriate electrical interconnection structure between the light emitting structures.

Figure 21:
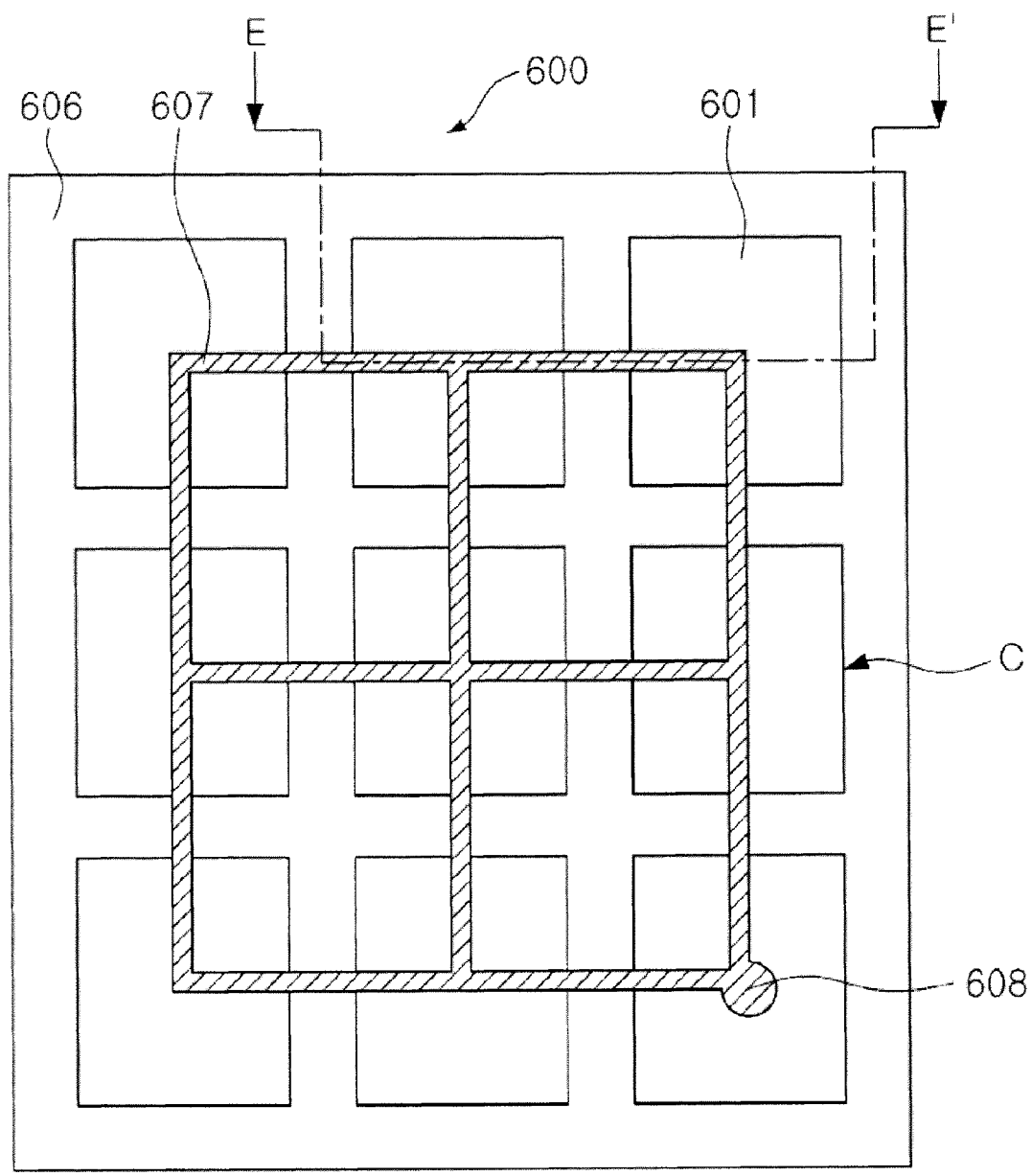
FIG. 21 is a schematic plan view illustrating a semiconductor light emitting device according to another embodiment of the present invention.
Figure 22:
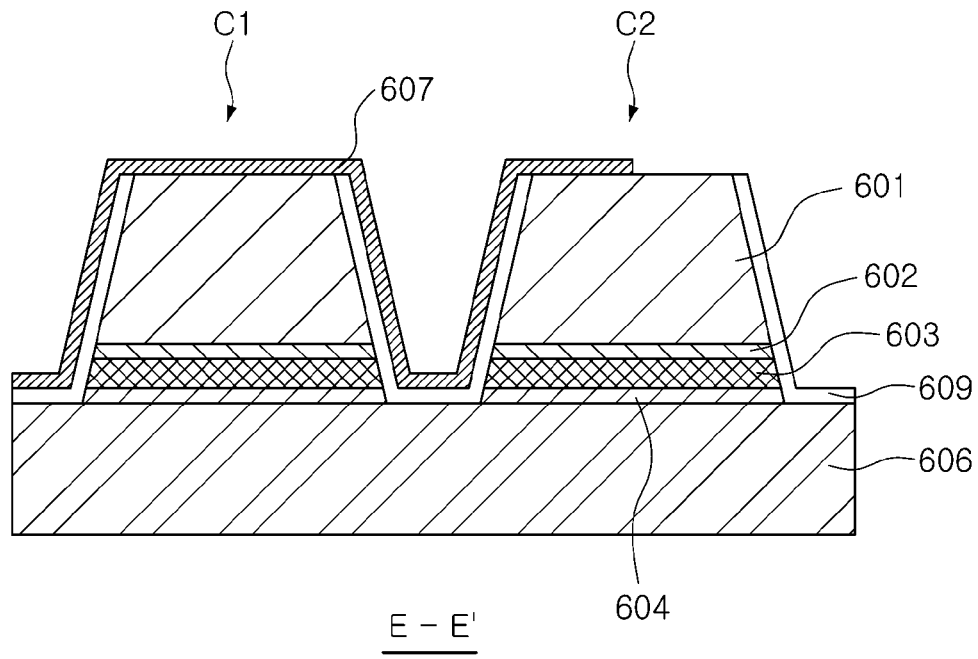
FIG. 22 is a schematic cross-sectional view taken along line E1-E1' of FIG. 21.

FIG. 21 is a schematic plan view illustrating a semiconductor light emitting device according to another embodiment of the present invention, and FIG. 22 is a schematic cross-sectional view taken along line E1-E1' of FIG. 21.

Referring to FIGS. 21 and 22, the semiconductor light emitting device 600 includes a plurality of light emitting cells C arranged on a conductive substrate 606. Each of the light emitting cells C includes a first-conductivity-type semiconductor layer 601, an active layer 602, and a second-conductivity-type semiconductor layer 603. A reflective metal layer 604 may be disposed between the light emitting cells C and the conductive substrate 606, specifically, between the second-conductivity-type semiconductor layer 603 and the conductive substrate 606. The reflective metal layer 604 is not a requisite element but an optional element. An interconnection structure 607 for electrically connecting the plurality of light emitting cells C is formed on the first-conductivity-type semiconductor layer 601. A pad 608 connected to the interconnection structure 607 may be further provided. An external electric signal is applied through the pad 608. In this case, as illustrated in FIG. 22, the interconnection structure 607 is formed along the surfaces of the light emitting cells C1 and C2 to connect the first-conductivity-type semiconductor layers 601 provided in the two light emitting cells C1 and C2. The active layer 602, the second-conductivity-type semiconductor layer 603, the reflective metal layer 604, and the conductive substrate 606 may be electrically separated from one another by an insulation part 609. In this embodiment, since the electrical connection structure of the second-conductivity-type semiconductor layer 603 can be performed by the conductive substrate 606, an additional interconnection structure need not be formed. In addition, since the first-conductivity-type semiconductor layer 601 or the second-conductivity-type semiconductor layer 603 need not be mesa-etched, a sufficient light emitting area can be ensured.

The conductive substrate 606 serves as a support body which supports the light emitting structures in a subsequent process such as a laser lift-off process. The conductive substrate 606 may be formed of one or more materials selected from Au, Ni, Al, Cu, W, Si, Se, and GaAs. For example, the conductive substrate 606 may be formed of a material in which Al is doped into Si. In this case, the conductive substrate 606 may be formed by a plating process or a bonding process according to the selected material. The conductive substrate 606 is electrically connected to the second-conductivity-type semiconductor layer 603 of each light emitting cell C. Accordingly, in this embodiment, the light emitting cells C are electrically connected in parallel. The reflective metal layer 604 may reflect light emitted from the active layer 602 in an upward direction of the device, that is, in a direction of the first-conductivity-type semiconductor layer 601. Furthermore, the reflective metal layer 604 may form an ohmic contact with the second-conductivity-type semiconductor layer 603 in consideration of electrical properties. Considering such a function, the reflective metal layer 604 may include Ag, Ni, Al, Rh, Pd, Ir, Ru, Mg, Zn, Pt, or Au. In this case, although not illustrated in detail, reflection efficiency can be improved by employing the reflective metal layer 604 in a multilayer structure. Examples of the reflective metal layer having the multilayer structure include Ni/Ag, Zn/Ag, Ni/Al, Pd/Ag, Pd/Al, Ir/Ag, Ir/Au, Pt/Ag, Pt/Al, and Ni/Ag/Pt. Although it is illustrated that the reflective metal layer 604 is provided in each light emitting cells C, the reflective metal layer 604 may also be integrally formed over the entirety of the light emitting cells C.

Figure 23:
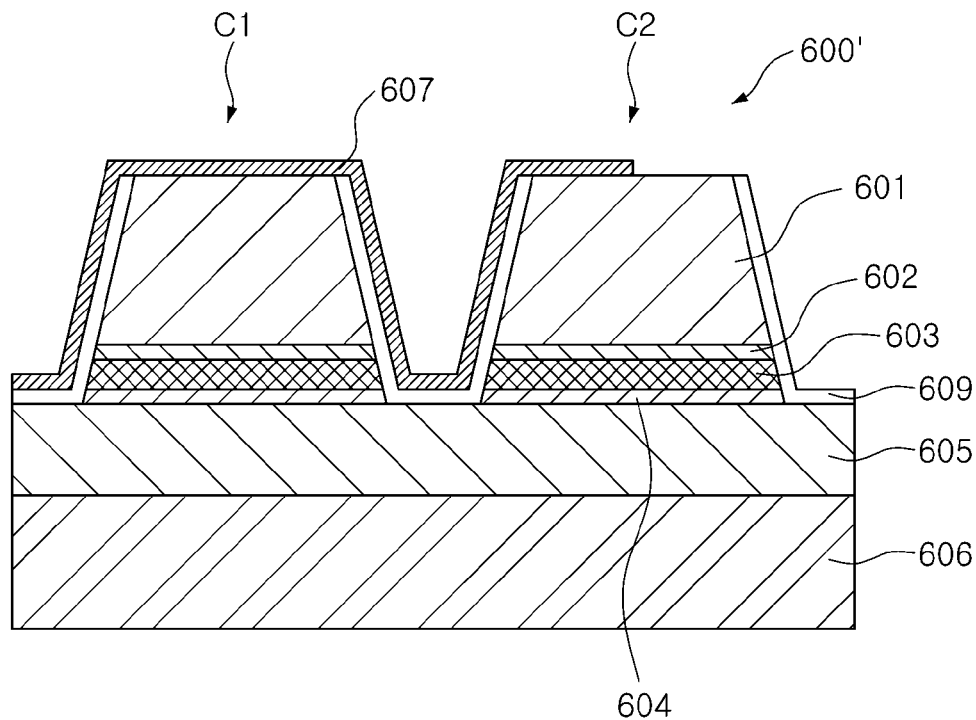
FIG. 23 is a schematic cross-sectional view illustrating a modification of the semiconductor light emitting device of FIG. 21.
Figure 24:
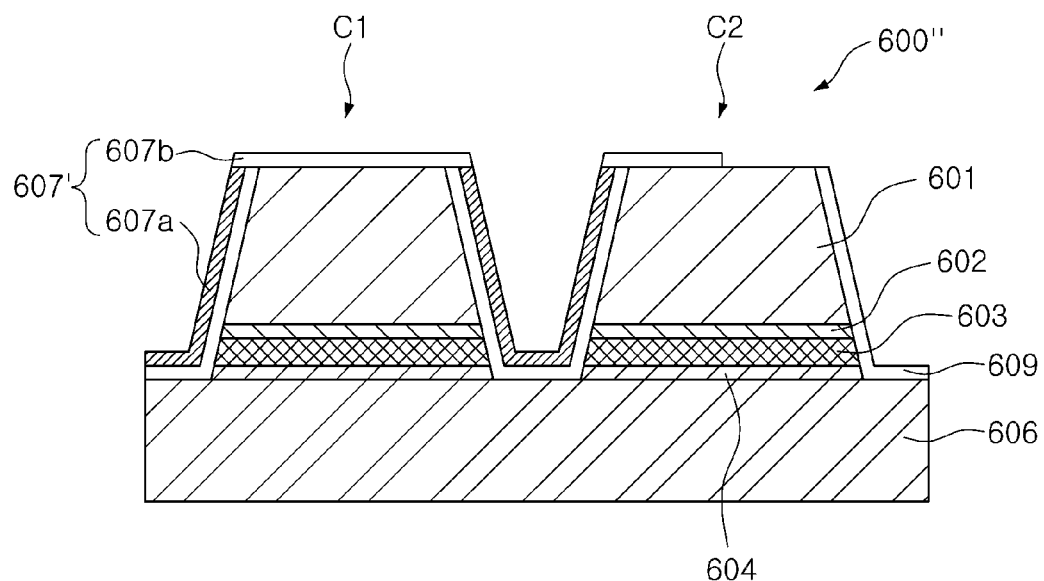
FIG. 24 is a schematic cross-sectional view illustrating a modification of the semiconductor light emitting device of FIG. 21.

FIGS. 23 and 24 are schematic cross-sectional views illustrating a modification of the semiconductor light emitting device of FIG. 21. Referring to FIG. 23, the semiconductor light emitting device 600' further includes a barrier layer 605 in the embodiment of FIG. 21. The barrier layer 605 may be integrally formed over the entirety of the light emitting cells C1 and C2. The barrier layer 605 may be formed between the conductive substrate 606 and the light emitting cells C1 and C2 in order to prevent impacts or unintended diffusion of materials during a process of bonding the conductive substrate 606 to the light emitting structure. The barrier layer 605 may be formed of TiW. Referring to FIG. 24, an interconnection structure 607' of a semiconductor light emitting device 600" may be divided into a metal region 607a and a transparent region 607b. Light loss can be reduced by forming an upper region of at least a first-conductivity-type semiconductor layer 601 as the transparent region 607a. In this case, the transparent region 607b of the interconnection structure 607' may be formed of transparent conductive oxide.

Figure 25:
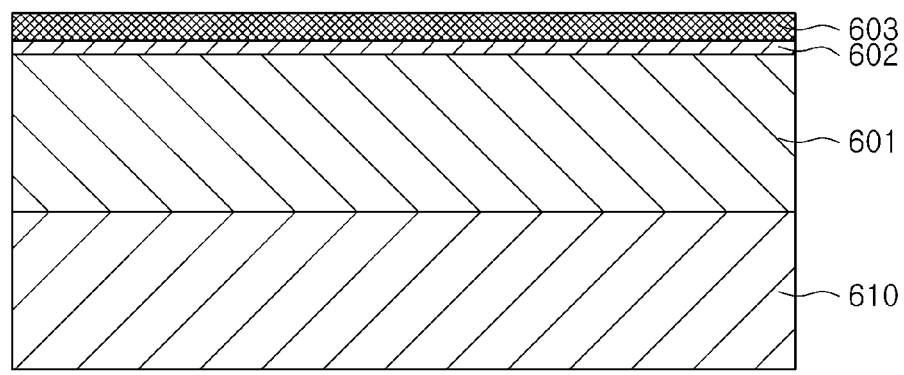
FIGS. 25 through 28 are cross-sectional views explaining a method for manufacturing the semiconductor light emitting device of FIG. 21 according to an embodiment of the present invention.
Figure 26:
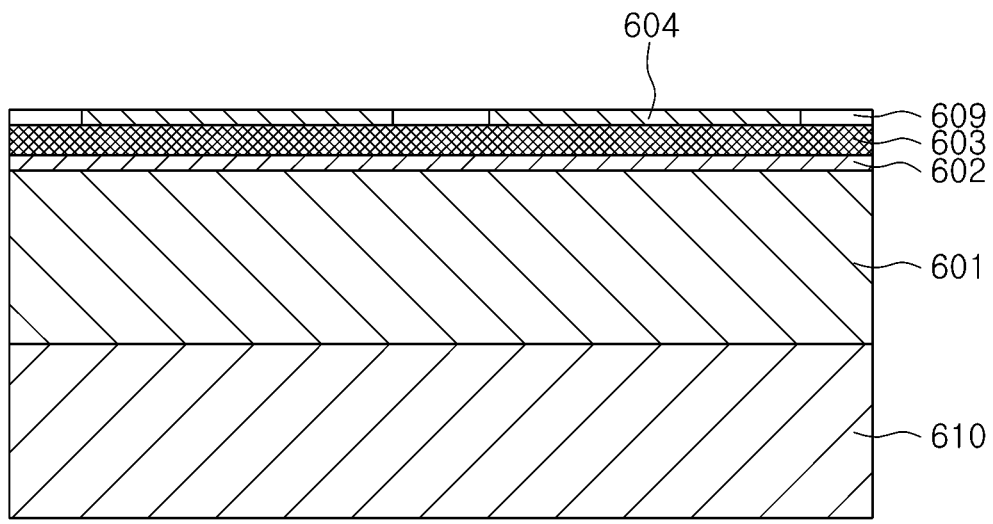

FIGS. 25 through 28 are cross-sectional views explaining a method for manufacturing the semiconductor light emitting device of FIG. 21 according to an embodiment of the present invention. As illustrated in FIG. 25, a light emitting lamination body is formed by sequentially growing a first-conductivity-type semiconductor layer 601, an active layer 602, and a second-conductivity-type semiconductor layer 603 by using one or more semiconductor layer growth processes, such as a MOCVD process, an HVPE process, and an MBE process. As illustrated in FIG. 26, an insulation part 609 having an open region is formed on the second-conductivity-type semiconductor layer 603, and a reflective metal layer 604 is formed to fill the open region. In this case, the insulation part 609 and the reflective metal layer 604 may be formed using a deposition process or a sputtering process known in the art.

Figure 27:
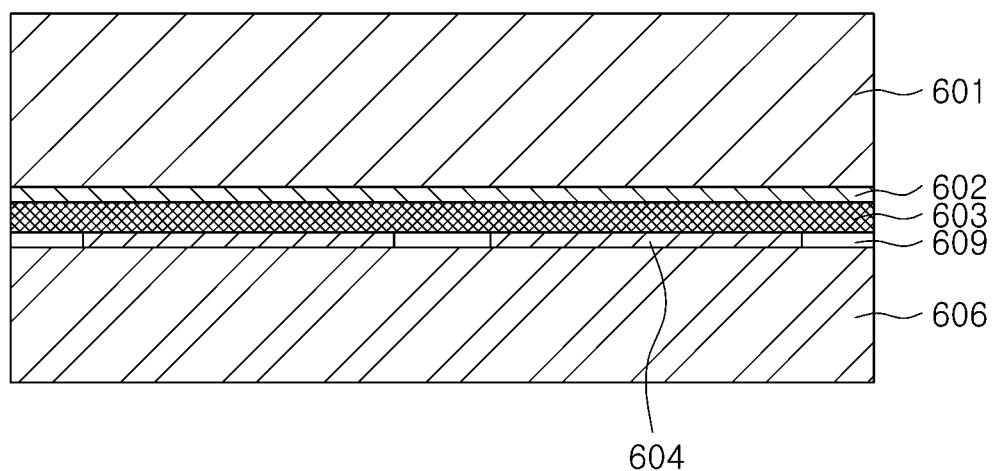

As illustrated in FIG. 27, a conductive substrate 606 is formed on the reflective metal layer 604. For example, a bonding attachment layer (not shown) formed of an eutectic metal may be applied between the reflective metal layer 604 and the conductive substrate 606, and the conductive substrate 606 may be attached thereto. A growth substrate 610 is separated from the light emitting lamination body. The growth substrate 610 may be separated using a laser lift-off process or a chemical lift-off process. FIG. 27 illustrates a state in which the growth substrate 610 is removed, while being rotated by 180 degrees in comparison with FIG. 26.

Figure 28:
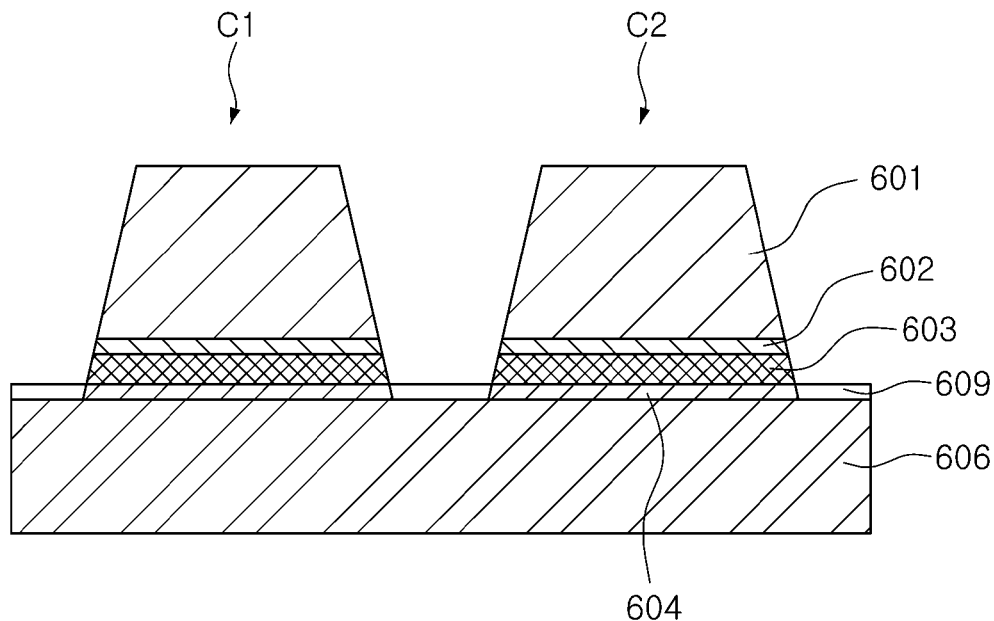

As illustrated in FIG. 28, an inter-cell separation process is performed to remove a region between the light emitting cells C1 and C2, thereby forming a plurality of light emitting cells C1 and C2. In this case, the inter-cell separation process may be performed using a known etching process such as an ICP-RIE process. During this process, the insulation part 609 may serve as an etching barrier layer. Although not illustrated, an insulation part 609 is further formed on the surfaces of the light emitting cells C1 and C2, and an interconnection structure 607 is formed to connect to the first-conductivity-type semiconductor layer 601. In this manner, the semiconductor light emitting device 600 illustrated in FIG. 21 is obtained.

Figure 29:
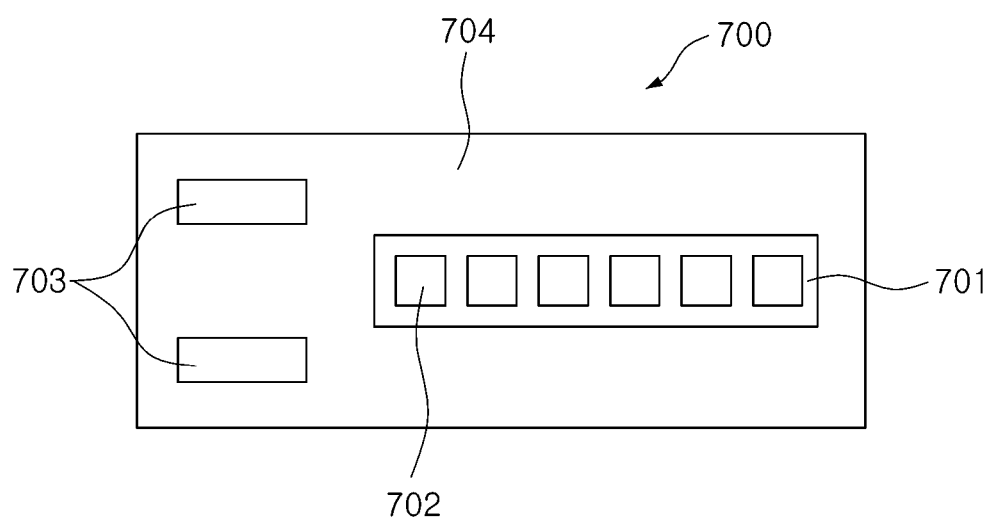
FIG. 29 is a schematic configuration diagram illustrating the exemplary use of the semiconductor light emitting device according to the embodiment of the present invention.

Meanwhile, FIG. 29 is a schematic configuration diagram illustrating the exemplary use of the semiconductor light emitting device according to the embodiment of the present invention. Referring to FIG. 29, an illumination apparatus 700 includes a light emitting module 701, a support structure 704 on which the light emitting module 701 is disposed, and a power supply 703. The light emitting module 701 includes one or more semiconductor light emitting devices 702 manufactured by the methods proposed in the embodiments of the present invention. Furthermore, the illumination apparatus 700 includes a feedback circuit which compares an amount of light emitted from the semiconductor light emitting device 702 with a preset amount of light, and a memory device which stores information on desired luminance or color rendering. The illumination apparatus 700 may be used as indoor illumination, such as lamps or plate light, or outdoor illumination, such as streetlights or signs. In addition, the illumination apparatus 700 may be used in various means of transportation, for example, vehicles, such as ships or airplanes. Moreover, the illumination apparatus 700 will be widely used in household appliances, such as TVs or refrigerators, and medical appliances.

When the semiconductor light emitting devices according to exemplary embodiments of the present invention are used, the current density per unit area is increased to improve the light extraction efficiency thereof. Furthermore, white light having high color rendering can be obtained.

In addition, the semiconductor light emitting devices according to exemplary embodiments of the present invention can obtain high-efficiency white light without using phosphors. Moreover, when the semiconductor light emitting device are provided with a plurality of light emitting cells, a sufficient light emitting area can be ensured.

While the present invention has been shown and described in connection with the exemplary embodiments, it will be apparent to those skilled in the art that modifications and variations can be made without departing from the spirit and scope of the invention as defined by the appended claims.

What is claimed is:

1. A semiconductor light emitting device comprising:
   a substrate;
   a plurality of light emitting cells arranged on the substrate, each light emitting cell of the plurality of light emitting cells including a first-conductivity-type semiconductor layer, a second-conductivity-type semiconductor layer, and an active layer disposed between the first-conductivity-type semiconductor layer and the second-conductivity-type semiconductor layer to emit blue light;
   an interconnection structure electrically connecting at least one of the first-conductivity-type semiconductor layer and the second-conductivity-type semiconductor layer of one light emitting cell of the plurality of light emitting cells to at least one of the first-conductivity-type semiconductor layer and the second-conductivity-type semiconductor layer of another light emitting cell of the plurality of light emitting cells; and
   a light conversion part disposed in at least a portion of a light emitting region defined by the plurality of light emitting cells, the light conversion part including at least one of a red light conversion part having a red light conversion material and a green light conversion part having a green light conversion material,
   wherein the interconnection structure has a portion disposed on a top surface and at least one of side surfaces of the one light emitting cell of the plurality of light emitting cells; and
   the light conversion part is disposed so as to cover the portion of the interconnection structure.

2. The semiconductor light emitting device of claim 1, wherein at least another portion of the light emitting region does not have the light conversion part disposed thereon.

3. The semiconductor light emitting device of claim 1, wherein the light conversion part includes at least one of a phosphor and a quantum dot.

4. The semiconductor light emitting device of claim 1, wherein the first-conductivity-type semiconductor layer of at least one of the plurality of light emitting cells is electrically connected to the second-conductivity-type semiconductor layer of another light emitting cell of the plurality of light emitting cells.

5. The semiconductor light emitting device of claim 1, wherein the first-conductivity-type semiconductor layer of the one light emitting cell of the plurality of light emitting cells is electrically connected to the first-conductivity-type semiconductor layer of the another light emitting cell.

6. The semiconductor light emitting device of claim 1, wherein the second-conductivity-type semiconductor layer of the one light emitting cell of the plurality of light emitting cells is electrically connected to the second-conductivity-type semiconductor layer of the another light emitting cell.

7. The semiconductor light emitting device of claim 1, wherein the first-conductivity-type semiconductor layers of the plurality of light emitting cells are integrally formed.

8. The semiconductor light emitting device of claim 1, wherein one of the red light conversion part and the green light conversion part is formed at each of the light emitting cells.

9. The semiconductor light emitting device of claim 1, wherein one of the red light conversion part and the green light conversion part is integrally formed with respect to two or more of the plurality of light emitting cells.

10. The semiconductor light emitting device of claim 1, wherein the light conversion part is disposed along the top surface and the at least one of the side surfaces of the light emitting cells.

11. The semiconductor light emitting device of claim 10, wherein the one light emitting cell of the plurality of light emitting cells has a mesa-portion exposing the first-conductivity-type semiconductor layer, and
    the light conversion part has a shape corresponding the shape of the one light emitting cell.

12. The semiconductor light emitting device of claim 1, wherein, the light conversion part includes the red light conversion part and the green light conversion part, the plurality of light emitting cells are divided into a red group including one or more first cells in which the red light conversion part is formed, a green group including one or more second cells in which the green light conversion part is formed, and a blue group including one or more third cells in which the red light conversion part and the green light conversion part are not formed, and the semiconductor light emitting device further comprises three pairs of pads connected to the red group, the green group, and the blue group, respectively.

13. The semiconductor light emitting device of claim 12, wherein currents applied through the pads to the red group, the green group, and the blue group are independently controlled.

14. The semiconductor light emitting device of claim 1, wherein the light conversion part is divided into a plurality of regions that are separated from each other, one region among the plurality of regions of the light conversion part is disposed so as to cover the one light emitting cell of the plurality of light emitting cells, and other regions among the plurality of regions of the light conversion part are disposed so as to cover other respective light emitting cells among the plurality of light emitting cells.

15. The semiconductor light emitting device of claim 1, wherein the light conversion part is disposed so as to cover the top surface and the side surfaces of one light emitting cell of the plurality of light emitting cells and to cover an area of the substrate adjacent to the one light emitting cell.

16. The semiconductor light emitting device of claim 1, wherein:
    each light emitting cell of the plurality of light emitting cells includes an insulation part disposed on the side surfaces, and
    the portion of the interconnection structure is disposed on the insulation part.

17. The semiconductor light emitting device of claim 1, further comprising:
    first and second pads for receiving an external electric signal to be applied to the semiconductor light emitting device,
    wherein the first and second electrode pads are disposed on respective first and second light emitting cells of the plurality of light emitting cells to as to respectively directly contact the first and second light emitting cells.

18. The semiconductor light emitting device of claim 17, wherein the interconnection structure electrically interconnects the plurality of light emitting cells between the first light emitting cell and the second light emitting cell such that the external electrical signal received at the first and second pads causes all light emitting cells of the plurality of light emitting cells to emit light.

19. The semiconductor light emitting device of claim 1, wherein:
    the first-conductivity-type semiconductor layer of each light emitting cell of the plurality of light emitting cells has a substantially rectangular area on the substrate,
    the active layer and the second-conductivity-type semiconductor layer of each light emitting cell of the plurality of light emitting cells are disposed on the substantially rectangular area of the first-conductivity-type semiconductor layer except for a corner area of the substantially rectangular area, and
    the interconnection structure is electrically connected to the first-conductivity-type semiconductor layer of the plurality of light emitting cells in the corner area of the substantially rectangular area of the first-conductivity-type semiconductor layer on which the active layer and the second-conductivity-type semiconductor layers are not disposed.

20. The semiconductor light emitting device of claim 1, wherein the corner area on which the active layer and the second-conductivity-type semiconductor layers are not disposed has a shape of a quarter-circle.

* * * * *